US012734464B2

(12) United States Patent
Tsuzaki et al.

(10) Patent No.: US 12,734,464 B2
(45) Date of Patent: Sep. 15, 2026

(54) CRYSTALLIZATION DEVICE, CRYSTALLIZATION SYSTEM, AND CRYSTALLIZATION METHOD

(71) Applicant: TSUKISHIMA KIKAI CO., LTD., Tokyo (JP)

(72) Inventors: Hiroya Tsuzaki, Tokyo (JP); Shinichi Yamamoto, Yachiyo (JP); Yuma Nagasawa, Tokyo (JP); Tatsuya Kambe, Tokyo (JP)

(73) Assignee: Tsukishima Kikai Co., Ltd., Tokyo (JP)

( * ) Notice: Subject to any disclaimer, the term of this patent is extended or adjusted under 35 U.S.C. 154(b) by 370 days.

(21) Appl. No.: 18/283,267

(22) PCT Filed: Mar. 15, 2022

(86) PCT No.: PCT/JP2022/011609

§ 371 (c)(1),
(2) Date: Sep. 21, 2023

(87) PCT Pub. No.: WO2022/202489

PCT Pub. Date: Sep. 29, 2022

(65) Prior Publication Data

US 2024/0165538 A1 May 23, 2024

(30) Foreign Application Priority Data

Mar. 26, 2021 (JP) ................................ 2021-052574

(51) Int. Cl.
*B01D 9/02* (2006.01)
*C30B 35/00* (2006.01)
*B01D 9/00* (2006.01)

(52) U.S. Cl.
CPC ................ *B01D 9/02* (2013.01); *C30B 35/00* (2013.01); *B01D 2009/0086* (2013.01)

(58) Field of Classification Search
CPC .. B01D 2009/0086; B01D 9/005; B01D 9/02; B01F 23/431; B01F 25/53;
(Continued)

(56) References Cited

U.S. PATENT DOCUMENTS 2,392,542 A 1/1946 Matuszak
2,495,147 A 1/1950 Street
(Continued)

FOREIGN PATENT DOCUMENTS

CN 103585781 A 2/2014
CN 208003956 U * 10/2018 .............. B01J 19/18
(Continued)

OTHER PUBLICATIONS

English computer translation of CN-109016216-A (Year: 2025).*
(Continued)

*Primary Examiner* — Matthew J Song
(74) *Attorney, Agent, or Firm* — Hoffmann & Baron LLP

(57) ABSTRACT

A crystallization device (4) includes a stirring blade (W) including a plurality of radially penetrating holes (h) and rotating about a rotating shaft (3), a reaction tank (1) having a bottomed cylindrical shape and concentrically accommodating the stirring blade (W) inside, a first liquid supply portion (5*a*) provided on the reaction tank (1) and supplying a first reaction liquid (L1) to the inside of the reaction tank (1), and a second liquid supply portion (5*b*) provided on the stirring blade (W) and supplying a second reaction liquid (L2).

20 Claims, 12 Drawing Sheets

(58) Field of Classification Search
CPC .............. B01F 27/1152; B01F 27/1161; B01F 27/2122; B01F 27/941; B01F 35/5312; C30B 35/00
See application file for complete search history.

(56) References Cited

U.S. PATENT DOCUMENTS

| | | | | |
|---|---|---|---|---|
| 7,173,150 | B2 * | 2/2007 | Yazaki | C07C 51/47 562/483 |
| 2010/0155310 | A1 | 6/2010 | Enomura | |
| 2018/0280910 | A1 | 10/2018 | Cave | |

FOREIGN PATENT DOCUMENTS

| | | | | |
|---|---|---|---|---|
| CN | 109016216 | A | * 12/2018 | B29B 7/76 |
| CN | 110678254 | A | 1/2020 | |
| CN | 111841475 | A | 10/2020 | |
| JP | H11347388 | A | 12/1999 | |
| JP | 3256801 | B2 | 2/2002 | |
| JP | 2009112892 | A | 5/2009 | |
| JP | 2010022894 | A | 2/2010 | |
| JP | 2010137183 | A | 6/2010 | |
| JP | 2016087590 | A | 5/2016 | |
| WO | 2009008393 | A1 | 1/2009 | |

OTHER PUBLICATIONS

English computer translation of CN-208003956-U (Year: 2025).*
European Search Report corresponding to Application No. 22775279.7-1017/4316621 PCT/JP2022011609, dated Dec. 9, 2024.
Office Action issued in connection with Chinese Application No. 202280023284.9, dated Aug. 2, 2025.
International Search Report for PCT/JP2022/011609; May 31, 2022.

* cited by examiner

FIG. 3

CRYSTALLIZATION DEVICE, CRYSTALLIZATION SYSTEM, AND CRYSTALLIZATION METHOD

TECHNICAL FIELD

This application is a U.S. National Phase application of International Application No. PCT/JP2022/011609 filed Mar. 15, 2022, which claims priority to Japanese Patent Appln. No. 2021-052574, filed Mar. 26, 2021, the disclosures of which are incorporated herein by reference.

The present invention relates to a crystallization device, a crystallization system, and a crystallization method.

BACKGROUND ART

Crystallization devices described in Patent Document 1 to Patent Document 4 are known as a crystallization device that obtains particles derived from a raw material in a raw material solution by mixing a plurality of raw material solutions.

In the crystallization device as described above, stirring is promoted by rotating a stirring blade provided in a liquid mixture of a plurality of raw material solutions to apply a shearing force to the liquid mixture. In order to generate fine particles with a more uniform particle size and higher quality, it is important to promote a reaction by efficiently transmitting the shearing force generated by rotating the stirring blade at high velocity, to a reaction field in which the reaction in which the plurality of raw material solutions come into contact with each other to generate particles. In order to achieve efficient transmission of the shearing force, attempts have been made to minimize a clearance between the stirring blade, which is a rotor, and a reaction tank, a reaction liquid supply nozzle, or the like, which is a stator.

However, as a rotation rate of the stirring blade is faster, from the viewpoint of manufacturing accuracy, a degree of difficulty of minimizing the clearance between the stirring blade and the reaction tank or between the stirring blade and the reaction liquid supply nozzle in manufacturing an industrial-scale device are higher.

CITATION LIST

Patent Documents

[Patent Document 1]
Japanese Unexamined Patent Application, First Publication No. 2010-137183

[Patent Document 2]
Japanese Unexamined Patent Application, First Publication No. 2010-022894

[Patent Document 3]
Japanese Patent No. 3256801

[Patent Document 4]
Japanese Unexamined Patent Application, First Publication No. 2016-87590

SUMMARY OF INVENTION

Technical Problem

The present invention has been made under such a background, and an object thereof is to provide a crystallization device, a crystallization system, and a crystallization method capable of minimizing a clearance between a stirring blade and a reaction liquid supply nozzle without requiring high manufacturing accuracy and capable of setting a range within a very close distance, for example, 2 mm from inner and outer peripheries of the stirring blade having a highest shearing force, as a reaction beginning point at which a reaction begins.

Solution to Problem

In order to achieve such an object by solving the problems described above, the present invention proposes the following means.

A first aspect of the present invention relates to a crystallization device including a stirring blade including a plurality of radially penetrating holes and rotating about a center axis, a reaction tank having a bottomed cylindrical shape and concentrically accommodating the stirring blade inside, a first liquid supply portion provided on the reaction tank and supplying a first reaction liquid to the inside of the reaction tank, and a second liquid supply portion provided on the stirring blade and supplying a second reaction liquid to the inside of the reaction tank.

According to the first aspect of the present invention, since the second reaction liquid is supplied from the second liquid supply portion provided on the stirring blade, it is possible to supply the second reaction liquid to a range within a very close distance, for example, 2 mm from inner and outer peripheries of the stirring blade having a highest shearing force without requiring high manufacturing accuracy as in a case in which the reaction liquid supply nozzle and the stirring blade are provided separately. In addition, since the stirring blade includes the plurality of radially penetrating holes, a liquid mixture of the first reaction liquid and the second reaction liquid reacts while passing through the holes toward a radially outer side of the stirring blade and moving to an outer peripheral side of the stirring blade, due to the influence of a centrifugal force, so that it is possible to further promote the stirring of the liquid mixture in the range within the very close distance, for example, 2 mm from the inner and outer peripheries of the stirring blade having the highest shearing force.

A second aspect of the present invention relates to the crystallization device according to the first aspect, in which the stirring blade includes a cylindrical portion having a cylindrical shape, a disk portion having a disk shape and having an outer edge portion fixed to an inner peripheral surface of the cylindrical portion, and a rotating shaft extending upward along the center axis from a center of the disk portion in plan view, the second reaction liquid is flowable inside the disk portion and the rotating shaft, and the second liquid supply portion is provided on the outer edge portion of the disk portion.

According to the second aspect of the present invention, since the second liquid supply portion is provided on the outer edge portion of the disk portion, it is possible to supply the second reaction liquid to the range within the very close distance, for example, 2 mm from the inner and outer peripheries of the stirring blade having the highest shearing force.

A third aspect of the present invention relates to the crystallization device according to the second aspect, in which the second liquid supply portion is open downward.

According to the third aspect of the present invention, since the second liquid supply portion is open downward, it is possible to supply the second reaction liquid to the range within the very close distance, for example, 2 mm from the inner and outer peripheries of the stirring blade having the highest shearing force.

A fourth aspect of the present invention relates to the crystallization device according to the second aspect, in which the second liquid supply portion is open toward a radially outer side and penetrates the cylindrical portion.

According to the fourth aspect of the present invention, since the second liquid supply portion is open toward the radially outer side and penetrates the cylindrical portion, it is possible to supply the second reaction liquid to the range within the very close distance, for example, 2 mm from the inner and outer peripheries of the stirring blade having the highest shearing force.

A fifth aspect of the present invention relates to the crystallization device according to the third or fourth aspect, in which, in the cylindrical portion above the disk portion, the plurality of radially penetrating holes are blocked, and a second disk portion having a disk shape and having an outer edge portion fixed to the inner peripheral surface of the cylindrical portion is provided on an upper end portion of the cylindrical portion.

According to the fifth aspect of the present invention, it is possible to supply the second reaction liquid supplied from the second liquid supply portion to the range within the very close distance, for example, 2 mm from the inner and outer peripheries of the stirring blade having the highest shearing force, and it is possible to reduce a resistance force in a case in which the stirring blade rotates, so that it is possible to reduce power for rotating the stirring blade.

A sixth aspect of the present invention relates to the crystallization device according to the third aspect, in which the disk portion is provided on an upper end portion of the cylindrical portion.

According to the sixth aspect of the present invention, since the disk portion is provided on the upper end portion of the cylindrical portion, it is possible to supply the second reaction liquid supplied from the second liquid supply portion to the range within the very close distance, for example, 2 mm from the inner and outer peripheries of the stirring blade having the highest shearing force, and since the stirring blade is not provided above the disk portion, it is possible to obtain the stirring blade having a lightweight and simple structure.

A seventh aspect of the present invention relates to the crystallization device according to any one of the first to sixth aspects, in which a peripheral velocity of the stirring blade is 5 m/seconds or more and 50 m/seconds or less.

According to the seventh aspect of the present invention, since the peripheral velocity of the stirring blade is 5 m/seconds or more and 50 m/seconds or less, it is possible to apply a sufficient shearing force to the liquid mixture of the first reaction liquid and the second reaction liquid.

An eighth aspect of the present invention relates to the crystallization device according to any one of the second to seventh aspects, in which, in a case in which a clearance between an outer peripheral surface of the cylindrical portion and an inner peripheral surface of the reaction tank is denoted by L3 and a height of the cylindrical portion is denoted by H, H/L3 is 10 or more.

According to the eighth aspect of the present invention, since the clearance between the outer peripheral surface of the stirring blade and the inner peripheral surface of the reaction tank is set in a range in which a degree of difficulty of manufacturing is not excessively high with respect to a size of the stirring blade. In a case in which an industrial-scale device is manufactured, it is possible to set the range within the very close distance (for example, within 2 mm) from the inner and outer peripheries of the stirring blade having the highest shearing force, as a reaction beginning point at which a reaction between the first reaction liquid and the second reaction liquid begins.

A ninth aspect of the present invention relates to the crystallization device according to any one of the first to eighth aspects, in which a plurality of second liquid supply portions that include the second liquid supply portion are provided.

According to the ninth aspect of the present invention, since the plurality of second liquid supply portions are provided, it is possible to more quickly mix the second reaction liquid with the first reaction liquid than in a case in which a single second liquid supply portion is provided.

A tenth aspect of the present invention relates to the crystallization device according to the first aspect, in which the stirring blade includes a columnar portion having a columnar shape, a disk base portion provided concentrically with the columnar portion on an upper end portion of the columnar portion, a rotating shaft extending upward along the center axis from a center of the disk base portion in plan view, and a porous plate having a cylindrical shape and provided concentrically with the columnar portion on a radially outer side of the columnar portion, the porous plate extends downward from an outer edge of the disk base portion, the second reaction liquid is flowable inside the rotating shaft, the disk base portion, and the columnar portion, and a plurality of second liquid supply portions that include the second liquid supply portion are provided on an outer peripheral surface of the columnar portion at intervals in an up-down direction.

According to the tenth aspect of the present invention, it is possible to supply the second reaction liquid to the range within the very close distance, for example, 2 mm from the inner and outer peripheries of the stirring blade having the highest shearing force. And since the plurality of second liquid supply portions are provided at intervals in the up-down direction, it is possible to more uniformly mix the first reaction liquid and the second reaction liquid, and it is possible to apply the influence of the shearing force to a larger number of places, it is possible to produce uniform and fine particles.

An eleventh aspect of the present invention relates to the crystallization device according to the first aspect, in which the stirring blade includes a columnar portion having a columnar shape, a rotating shaft extending upward along the center axis from a center of the columnar portion in plan view, and a porous plate having a cylindrical shape and provided concentrically with the columnar portion on a radially outer side of the columnar portion, the porous plate is fixed to a connecting rod extending from an outer peripheral surface of the columnar portion toward the radially outer side, the second reaction liquid is flowable inside the rotating shaft and the columnar portion, and a plurality of second liquid supply portions that include the second liquid supply portion are provided on the outer peripheral surface of the columnar portion at intervals in an up-down direction.

According to the eleventh aspect of the present invention, it is possible to supply the second reaction liquid to the range within the very close distance, for example, 2 mm from the inner and outer peripheries of the stirring blade having the highest shearing force. And since the plurality of second liquid supply portions are provided at intervals in the up-down direction, it is possible to more uniformly mix the first reaction liquid and the second reaction liquid, it is possible to apply the influence of the shearing force to a larger number of places, and it is possible to produce uniform and fine particles.

A twelfth aspect of the present invention relates to the crystallization device according to the tenth or eleventh aspect, in which extension pipes extending from the plurality of second liquid supply portions toward the radially outer side are provided.

According to the twelfth aspect of the present invention, it is possible to supply the second reaction liquid to the range within the very close distance, for example, 2 mm from the inner and outer peripheries of the stirring blade having the highest shearing force. In addition, it is possible to widen the interval between the outer peripheral surface of the columnar portion and the inner peripheral surface of the porous plate. Accordingly, it is possible to promote the circulation of the reaction liquid.

A thirteenth aspect of the present invention relates to a crystallization system including the crystallization device according to any one of the first to twelfth aspects, a retention tank that retains a product transferred from the reaction tank, and a circulation pump that circulates the product between the retention tank and the crystallization device.

According to the thirteenth aspect of the present invention, it is possible to obtain the crystallization system that can obtain the technical effect of the crystallization device according to any one of the first to twelfth aspects.

A fourteenth aspect of the present invention relates to a crystallization method in a crystallization device that includes a stirring blade including a plurality of radially penetrating holes and rotating about a center axis, a reaction tank having a bottomed cylindrical shape and concentrically accommodating the stirring blade inside, a first liquid supply portion supplying a first reaction liquid to the inside of the reaction tank, and a second liquid supply portion provided on the stirring blade and supplying a second reaction liquid, and that obtains a product by mixing two or more liquids, the crystallization method including a first liquid supply step of supplying the first reaction liquid from the first liquid supply portion to the reaction tank, and a second liquid supply step of supplying the second reaction liquid from the second liquid supply portion to the reaction tank 1.

According to the fourteenth aspect of the present invention, since the second reaction liquid is supplied from the second liquid supply portion provided on the stirring blade, it is possible to supply the second reaction liquid to a range within a very close distance, for example, 2 mm from inner and outer peripheries of the stirring blade having a highest shearing force without requiring high manufacturing accuracy as in a case in which the reaction liquid supply nozzle and the stirring blade are provided separately. In addition, since the stirring blade includes the plurality of radially penetrating holes, a liquid mixture of the first reaction liquid and the second reaction liquid reacts while passing through the holes toward a radially outer side of the stirring blade and moving to an outer peripheral side of the stirring blade, due to the influence of a centrifugal force, so that it is possible to further promote the stirring of the liquid mixture in the range within the very close distance, for example, 2 mm from the inner and outer peripheries of the stirring blade having the highest shearing force.

A fifteenth aspect of the present invention relates to the crystallization method according to the fourteenth aspect, in which the stirring blade further includes a cylindrical portion having a cylindrical shape, a disk portion having a disk shape and having an outer edge portion fixed to an inner peripheral surface of the cylindrical portion, and a rotating shaft extending upward along the center axis from a center of the disk portion in plan view, the second reaction liquid is flowable inside the disk portion and the rotating shaft, and in the second liquid supply step, the second reaction liquid is supplied downward from the outer edge portion of the disk portion.

According to the fifteenth aspect of the present invention, since the second liquid supply is supplied downward from the outer edge portion of the disk portion, it is possible to supply the second reaction liquid to the range within the very close distance, for example, 2 mm from the inner and outer peripheries of the stirring blade having the highest shearing force.

A sixteenth aspect of the present invention relates to the crystallization method according to the fourteenth aspect, in which the stirring blade further includes a cylindrical portion having a cylindrical shape, a disk portion having a disk shape and having an outer edge portion fixed to an inner peripheral surface of the cylindrical portion, and a rotating shaft extending upward along the center axis from a center of the disk portion in plan view, the second reaction liquid is flowable inside the disk portion and the rotating shaft, and in the second liquid supply step, the second reaction liquid is supplied toward a radially outer side so as to pass through the cylindrical portion from the outer edge portion of the disk portion.

According to the sixteenth aspect of the present invention, since the second liquid supply is supplied toward the radially outer side through the cylindrical portion from the outer edge portion of the disk portion, it is possible to supply the second reaction liquid to the range within the very close distance, for example, 2 mm from the inner and outer peripheries of the stirring blade having the highest shearing force.

A seventeenth aspect of the present invention relates to the crystallization method according to the fourteenth aspect, in which the stirring blade includes a columnar portion having a columnar shape, a disk base portion provided concentrically with the columnar portion on an upper end portion of the columnar portion, a rotating shaft extending upward along the center axis from a center of the disk base portion in plan view, and a porous plate having a cylindrical shape and provided concentrically with the columnar portion on a radially outer side of the columnar portion, the porous plate extends downward from an outer edge of the disk base portion, the second reaction liquid is flowable inside the rotating shaft, the disk base portion, and the columnar portion, and in the second liquid supply step, the second reaction liquid is supplied toward the radially outer side from a plurality of second liquid supply portions that include the second liquid supply portion, which are provided on an outer peripheral surface of the columnar portion at intervals in an up-down direction.

According to the seventeenth aspect of the present invention, it is possible to supply the second reaction liquid supplied from the second liquid supply portion to the range within the very close distance, for example, 2 mm from the inner and outer peripheries of the stirring blade having the highest shearing force. In addition, it is possible to apply the influence of the shearing force to a larger number of places, and it is possible to produce uniform and fine particles. Accordingly, it is possible to more uniformly mix the first reaction liquid and the second reaction liquid.

An eighteenth aspect of the present invention relates to the crystallization method according to the fourteenth aspect, in which the stirring blade includes a columnar portion having a columnar shape, a rotating shaft extending upward along the center axis from a center of the columnar portion in plan view, and a porous plate having a cylindrical shape and provided concentrically with the columnar portion on a radially outer side of the columnar portion, the porous plate is fixed to a connecting rod extending from an outer peripheral surface of the columnar portion toward the radially outer side, the second reaction liquid is flowable inside the rotating shaft and the columnar portion, and in the second liquid supply step, the second reaction liquid is supplied toward the radially outer side from a plurality of second liquid supply portions that include the second liquid supply portion, which are provided on the outer peripheral surface of the columnar portion at intervals in an up-down direction.

According to the eighteenth aspect of the present invention, it is possible to supply the second reaction liquid supplied from the second liquid supply portion to the range within the very close distance, for example, 2 mm from the inner and outer peripheries of the stirring blade having the highest shearing force. In addition, it is possible to more uniformly mix the first reaction liquid and the second reaction liquid, it is possible to apply the influence of the shearing force to a larger number of places. Accordingly, it is possible to produce uniform and fine particles.

Advantageous Effects of Invention

According to the aspects of the present invention, it is possible to obtain the crystallization device, the crystallization system, and the crystallization method capable of minimizing the clearance between the stirring blade and the reaction liquid supply nozzle without requiring high manufacturing accuracy and capable of setting the range within the very close distance, for example, 2 mm from the inner and outer peripheries of the stirring blade having the highest shearing force as the reaction beginning point at which the reaction begins.

BRIEF DESCRIPTION OF DRAWINGS

FIG. 3 is a schematic view of a crystallization system including the crystallization device of the first embodiment according to the present invention.

DESCRIPTION OF EMBODIMENTS

Figure 1:
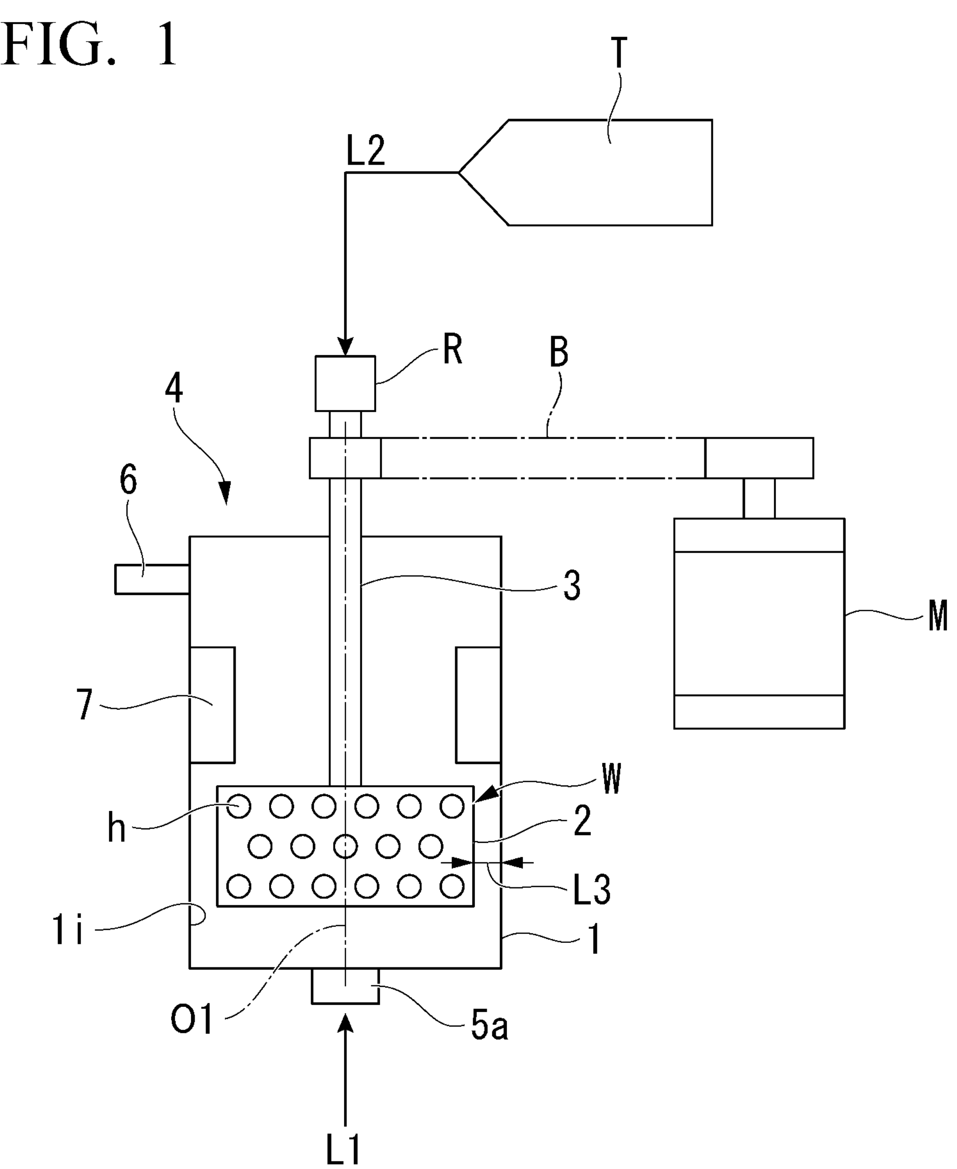
FIG. 1 is a longitudinal cross-sectional view of a crystallization device of a first embodiment according to the present invention.

A crystallization device 4 according to a first embodiment will be described below with reference to FIG. 1.

The crystallization device 4 includes a reaction tank 1 having a bottomed cylindrical shape and having a center axis O1 facing a vertical direction, and a stirring blade W having a cylindrical shape. The stirring blade W is rotatable about a hollow rotating shaft 3 extending upward from a center of the stirring blade W in plan view and is accommodated inside the reaction tank 1 with the center axis O1 as the same center axis. The rotating shaft 3 rotates by a rotation force supplied from a prime mover M provided outside the crystallization device 4 via a belt B. It should be noted that the prime mover M is not particularly limited as long as the prime mover M is a device that generates rotation power, such as a motor or an engine. In addition, the belt B that transmits the rotation force to the rotating shaft 3 is not particularly limited as long as the rotation force can be transmitted, such as a chain or a gear. It should be noted that the bottom surface of the reaction tank 1 may have a cone shape that protrudes downward in addition to having a planar shape as shown in the drawing. A discharge port 6 capable of discharging the slurry containing particles (crystals) generated in the reaction tank 1 to the next step is provided in an upper portion of the reaction tank 1. A baffle (baffle plate) 7 is provided above the stirring blade W in the reaction tank 1 in order to suppress the generation of a vortex and promote the stirring of a liquid mixture. The baffle 7 is configured by attaching flat plates or pipes having a columnar shape at regular intervals. It should be noted that the baffle 7 is provided as needed, and thus the baffle 7 does not have to be provided.

A lower portion of the reaction tank 1 is provided with a first liquid supply portion 5*a* to which a first reaction liquid L1 is supplied. The first reaction liquid L1 is supplied to the reaction tank 1 from the first liquid supply portion 5*a* in a desired amount.

Figure 2A:
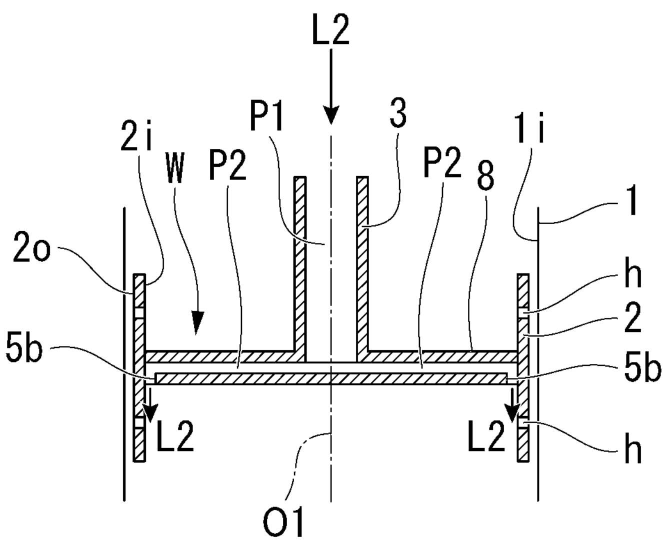
FIG. 2A is a longitudinal cross-sectional view of a schematic view showing a stirring blade of the crystallization device of the first embodiment according to the present invention.
Figure 2B:
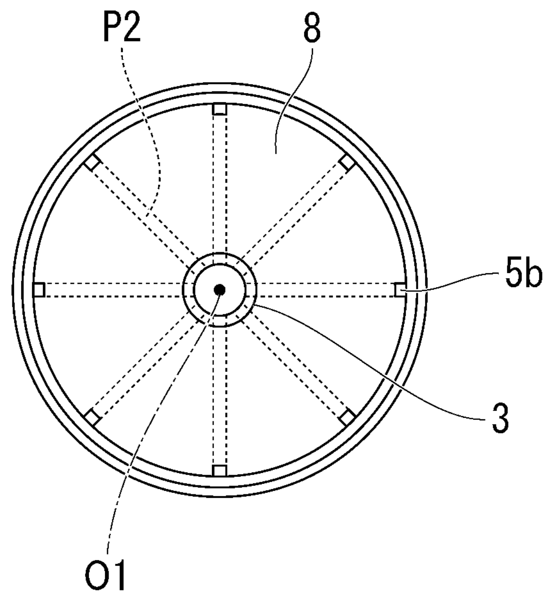
FIG. 2B is a plan view of the schematic view showing the stirring blade of the crystallization device of the first embodiment according to the present invention.

The stirring blade W of the crystallization device 4 according to the first embodiment will be described below with reference to FIGS. 1, 2A, and 2B.

The stirring blade W includes a cylindrical portion 2 and a disk portion 8 having a disk shape and having an outer edge portion fixed to an inner peripheral surface 2*i* of the cylindrical portion 2. The disk portion 8 is provided at a position at which a height of the cylindrical portion 2 is substantially half, but the present invention is not limited to this example, and the disk portion 8 may be provided below or above substantially half the height of the cylindrical portion 2. The rotating shaft 3 is fixed to the center of the disk portion 8 in plan view. The hollow inside of the rotating shaft 3 is a pipeline P1. Inside the disk portion 8, a plurality of pipelines P2 extend radially from the center toward the outer edge portion. The pipeline P1 of the rotating shaft 3 and the pipelines P2 of the disk portion 8 communicate with each other. A second reaction liquid L2 is supplied from a tank T provided outside the crystallization device 4 to the rotating shaft 3 of the stirring blade W. The second reaction liquid L2 is supplied to the hollow pipeline P1 of the rotating shaft 3 via a rotary joint R, and is then supplied to the pipeline P2 of the disk portion 8. A distal end of the pipeline P2 on the radially outer side of the reaction tank 1 is open downward and is used as a second liquid supply portion 5*b* for discharging the second reaction liquid L2. Therefore, the disk portion 8 is provided with a plurality of second liquid supply portions 5*b* at intervals in a circumferential direction of the disk portion. In the examples shown in FIGS. 2A and 2B, eight second liquid supply portions 5*b* are provided as shown in FIG. 2B. The number of the second liquid supply portions 5*b* is not limited, but it is desirable that the second liquid supply portions 5*b* are provided symmetrically with respect to the center axis O1.

In the present example, a distance between the inner peripheral surface 2*i* of the cylindrical portion 2 of the stirring blade W and the center of the second liquid supply portion 5*b* is 2 mm or less. In addition, in a case in which the distance (clearance) between an outer peripheral surface 2*o* of the cylindrical portion 2 of the stirring blade W and an inner peripheral surface 1*i* of the reaction tank 1 is denoted by L3 and the height of the stirring blade W (cylindrical portion 2) along the center axis O1 is denoted by H, H/L3, which is a ratio of H to L3, is preferably 10 or more. H/L3 is more preferably 25 or more. Therefore, even in a case in which a device having a size different from the size in the example is used, a similar device can be manufactured based on this ratio. The stirring blade W rotates at a peripheral velocity of 5 m/seconds or more and 50 m/seconds or less.

It should be noted that the ratio of H/L3 may be different from the above-described ratio depending on the purpose. For example, in a case in which it is desired to suppress crystal crushing, the ratio may be decreased from the above-described value.

The cylindrical portion 2 of the stirring blade W is provided with a plurality of holes h that penetrate in a radial direction of the cylindrical portion 2. Through these holes h, the first reaction liquid L1 and the second reaction liquid L2, or the liquid mixture thereof can flow. Therefore, the first reaction liquid L1 and the second reaction liquid L2, or the liquid mixture thereof can move from the inside to the outside of the stirring blade W or from the outside to the inside of the stirring blade W through the plurality of holes h. It should be noted that, in addition to the holes h, the disk portion 8 may be provided with a plurality of holes 9 penetrating in a direction of the center axis O1 (see FIGS. 5A and 5B to be described below). In this case, the first reaction liquid L1 and the second reaction liquid L2, or the liquid mixture thereof can move from the inside to the outside of the stirring blade W or from the outside to the inside of the stirring blade W through the holes 9, in addition to the plurality of holes h.

In such a crystallization device 4, the desired amount of the first reaction liquid L1 is supplied to the reaction tank 1 from the first liquid supply portion 5*a*. The first reaction liquid L1 may be supplied in an amount to the extent that the reaction tank 1 is filled (state of being fully filled with the liquid), or may be supplied in an amount to the extent that the first reaction liquid L1 is pressed against the inner peripheral surface 1*i* of the reaction tank 1 due to a centrifugal force generated in the first reaction liquid L1 by performing a circular movement about the center axis O1 of the reaction tank 1 in a case in which the stirring blade W rotates, and a liquid film of the first reaction liquid L1 is formed on the inner peripheral surface 1*i* of the reaction tank 1. The supply amount of the first reaction liquid L1 can be adjusted and a desired supply amount can be selected by adjusting an opening degree of an opening degree adjustment valve V which will be described below. Hereinafter, the description will be made on the assumption that the first reaction liquid L1 is supplied to the extent to obtain the state of being fully filled with the liquid. Alternatively, the reaction may be carried out in the reaction tank 1 after the first reaction liquid L1 is supplied to the extent to obtain the state of being fully filled with the liquid or the liquid film forming state described above, and then the supply of the first reaction liquid L1 is stopped, or the reaction may be continuously carried out in the reaction tank 1 while maintaining the first reaction liquid L1 at the flow rate to the extent to obtain the state of being fully filled with the liquid or the liquid film forming state described above.

In a state in which the reaction tank 1 is filled with the first reaction liquid L1, the second reaction liquid L2 is supplied inside the reaction tank 1 by rotating the stirring blade W and discharging the second reaction liquid L2 from the second liquid supply portion 5*b* along the inner peripheral surface 2*i* of the cylindrical portion 2 of the stirring blade W. In this way, the second reaction liquid L2 discharged from the second liquid supply portion 5*b* along the inner peripheral surface 2*i* of the cylindrical portion 2 of the stirring blade W comes into contact with the first reaction liquid L1 rotating with the rotation of the stirring blade W in the vicinity of the inner peripheral surface 2*i* of the cylindrical portion 2 of the stirring blade W in the reaction tank 1 filled with the first reaction liquid L1. In this manner, the first reaction liquid L1 and the second reaction liquid L2 come into contact with each other to generate a reaction and generate the particles.

In this case, by supplying the second reaction liquid L2 to the first reaction liquid L1 from the second liquid supply portion 5*b* of the stirring blade W rotating at the peripheral velocity of 5 m/seconds or more and 50 m/seconds or less, it is possible to uniformly mix the second reaction liquid L2 with the first reaction liquid L1.

Here, the centrifugal force is generated by the first reaction liquid L1 rotating with the rotation of the stirring blade W, the second reaction liquid L2 discharged from the second liquid supply portion 5*b* of the stirring blade W rotating at the peripheral velocity of 5 m/seconds or more and 50 m/seconds or less, and the liquid mixture thereof. Due to such centrifugal force, the first reaction liquid L1, the second reaction liquid L2, and the liquid mixture (hereinafter, may be collectively referred to as liquid mixture) are moved to the radially outer side of the cylindrical portion 2 of the stirring blade W, collides with the inner peripheral surface 1*i* of the reaction tank 1 through the plurality of holes h provided in the cylindrical portion 2 of the stirring blade W, and then are moved in an up-down direction along the inner peripheral surface 1*i* of the reaction tank 1. The liquid mixture mainly moved downward is attracted to the flow toward the radially outer side caused by the centrifugal force generated by the rotation of the stirring blade W. Then, the liquid mixture passes through the plurality of holes h provided in the cylindrical portion 2 of the stirring blade W again, collides with the inner peripheral surface 1*i* of the reaction tank 1. And then, the liquid mixture is moved in the up-down direction along the inner peripheral surface 1*i* of the reaction tank 1 to generate convection. Here, in a case in which the liquid mixture passes through the plurality of holes h, the liquid mixture is accelerated to the radially outer side due to the effect of the restriction flow path, so that a radial outward flow rate of the liquid mixture is highest in the vicinity of the plurality of holes h. Further, a shearing force in the circumferential direction is applied to the liquid mixture, which is present between the outer peripheral surface 2*o* and the inner peripheral surface 2*i* of the cylindrical portion 2 of the stirring blade W rotating at the peripheral velocity of 5 m/seconds or more and 50 m/seconds or less, and the inner peripheral surface 1*i* of the reaction tank 1 that is fixed. The closer the liquid mixture is to the inner peripheral surface 2*i* and the outer peripheral surface 2*o* of the cylindrical portion 2 of the stirring blade W, the greater the shearing force is applied to the liquid mixture. The shearing force applied to the liquid mixture is a major factor that determines the particle size and the uniformity of the particles to be obtained. In particular, as the applied shearing force is greater, the particles having a finer particle size can be obtained.

In the crystallization device 4 of the present embodiment, the second liquid supply portion 5*b* is provided on the outer edge portion of the disk portion 8. Specifically, as described above, the distance between the inner peripheral surface 2*i* of the cylindrical portion 2 of the stirring blade W and the center of the second liquid supply portion 5*b* is 2 mm or less. Therefore, the second reaction liquid L2 discharged from the second liquid supply portion 5*b* along the inner peripheral surface 2*i* of the cylindrical portion 2 of the stirring blade W, and the first reaction liquid L1 rotating with the rotation of the stirring blade W in the vicinity of the inner peripheral surface 2*i* of the cylindrical portion 2 of the stirring blade W come into contact with each other at a reaction beginning point for the first time, and the reaction begins. The shearing force is applied to the maximum extent at the reaction beginning point because of the centrifugal force in addition to the flow toward the radially outer side by the restriction flow path. Therefore, a region in which the maximum shearing force is applied can be set as the reaction beginning point. Specifically, the reaction beginning point can be formed in a region within a very close distance, for example, 2 mm, from the inner peripheral surface 2*i* and the outer peripheral surface 2*o* of the cylindrical portion 2 of the stirring blade W. Here, the liquid mixture can be moved from an inner peripheral side to an outer peripheral side of the cylindrical portion 2 through the plurality of holes h. Therefore, the stirring of the first reaction liquid L1 and the second reaction liquid L2 at the reaction beginning point is promoted by the shearing force. Therefore, the more uniform mixing of the first reaction liquid L1 and the second reaction liquid L2 begins at the reaction beginning point, and the mixing and the reaction are performed at a reaction field in which the reaction occurs along the flow of the liquid mixture. Accordingly, it is possible to generate the particles having a fine and uniform size. It should be noted that the baffle 7 has the effect of suppressing the generation of the vortex and promoting the stirring of the liquid mixture in a state in which the reaction tank 1 is fully filled with the liquid. On the other hand, it is not necessary to provide the baffle 7 in a state in which the reaction tank 1 is not fully filled with the liquid and the liquid film of the liquid mixture is formed. Here, the reaction beginning point indicates a region in which the reaction begins, and the reaction field indicates an entire field in which the reaction occurs. Therefore, the reaction beginning point is included in the reaction field.

It should be noted that the baffle 7 is not an essential configuration and does not have to be provided. For example, in a case in which a mechanical seal (not shown) is provided at a place of the reaction tank 1 into which the rotating shaft 3 is inserted, to obtain the complete state of being fully filled with the liquid and without an gas phase, the generation of the vortex is suppressed, and thus the baffle 7 does not have to be provided. In a case in which the baffle 7 is not provided, the flow path resistance is reduced, and the power of the prime mover M can be reduced.

It should be noted that the same effect as in a case of being fully filled with the liquid can be obtained even in a state in which the liquid film is formed in a state of not being fully filled with the liquid.

Figure 3:
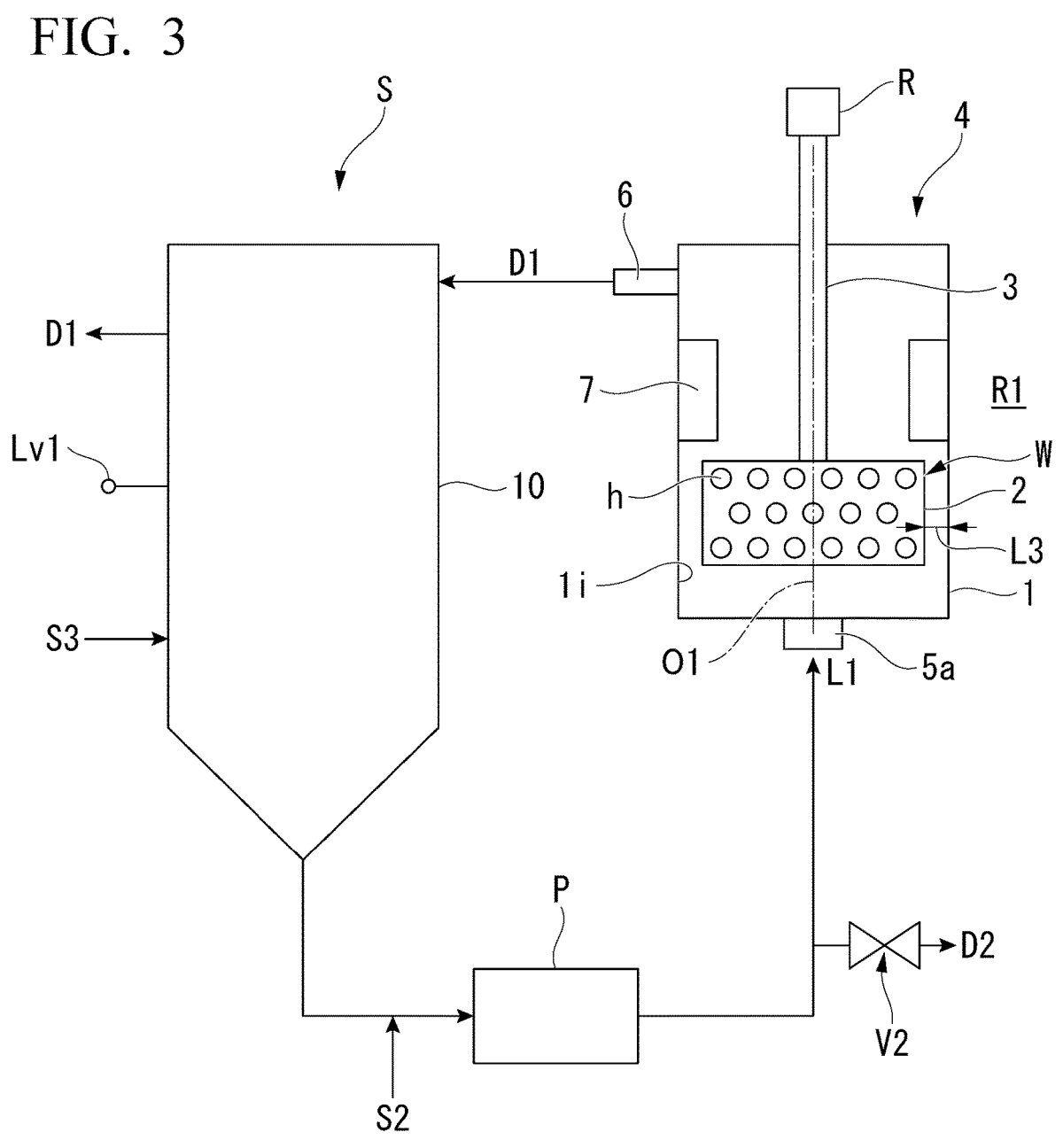

FIG. 3 is a schematic view of a crystallization system S including the crystallization device 4 of the first embodiment.

In the crystallization system S of the crystallization device 4, a retention tank 10 is provided on a downstream of the crystallization device 4, and slurry D1 containing the particles generated in the crystallization device 4 is transferred to the retention tank 10. A discharge port for discharging the slurry D1 is provided in an upper portion of the retention tank 10, and a first raw liquid S3 of the first reaction liquid L1 is supplied to the retention tank 10 through a tank (not shown). The retention tank 10 is provided with a pipeline for discharging the liquid mixture of the first raw liquid S3 and the slurry D1 to the outside, and this pipeline is connected to the crystallization device 4 via a circulation pump P. In the pipeline from the retention tank 10 to the crystallization device 4, a second raw liquid S2 of the first reaction liquid L1 may be supplied to an upstream side of the circulation pump P as needed, and a residual slurry D2 may be further discharged from a downstream side of the circulation pump P.

Here, a circulation amount of the liquid mixture of the first raw liquid S3 and the slurry D1 is adjusted by changing the rotation speed of the circulation pump P or by adjusting the opening degree of a circulation amount adjustment valve (not shown) installed on the downstream side of the circulation pump P. The retention time of the liquid mixture in the retention tank 10 is adjusted by changing a liquid level of the slurry retained in the retention tank 10. The liquid level of the slurry in the retention tank 10 is adjusted by selecting and using any of a plurality of discharge ports (only one discharge port is shown) of the slurry D1 installed at different heights on a side surface of the retention tank 10, or by automatically adjusting the flow rate of the residual slurry D2 discharged from the downstream side of the circulation pump P to the outside of the crystallization system S by the opening degree adjustment of an automatic valve V2 attached to the discharge port such that a numerical value of a level meter Lv 1 that detects the level of the retention tank 10 is a predetermined value.

With the crystallization system S including the crystallization device 4, it is possible to individually adjust the particle size of the reaction product in the crystallization device 4, the particle size distribution, the shearing force that affects the particle quality such as a degree of true sphericity, the circulation amount of the first reaction liquid L1, and the retention time of the slurry, and the control performance of the particle quality can be further improved.

Figure 4:
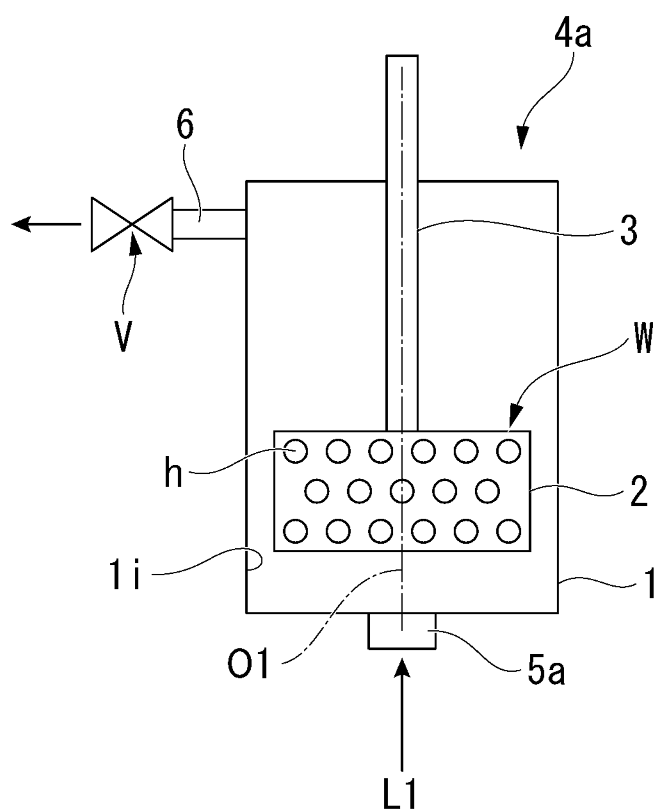
FIG. 4 is a schematic view showing a first modification example of the crystallization device of the first embodiment according to the present invention.

FIG. 4 is a schematic view showing a first modification example of the crystallization device 4 of the first embodiment.

In a crystallization device 4*a*, the opening degree adjustment valve V is provided on the discharge port 6. By adjusting the opening degree of the opening degree adjustment valve V, the reaction tank 1 can be selected between the state of being fully filled with the liquid and a liquid film state in which the liquid film is formed.

Figure 5A:
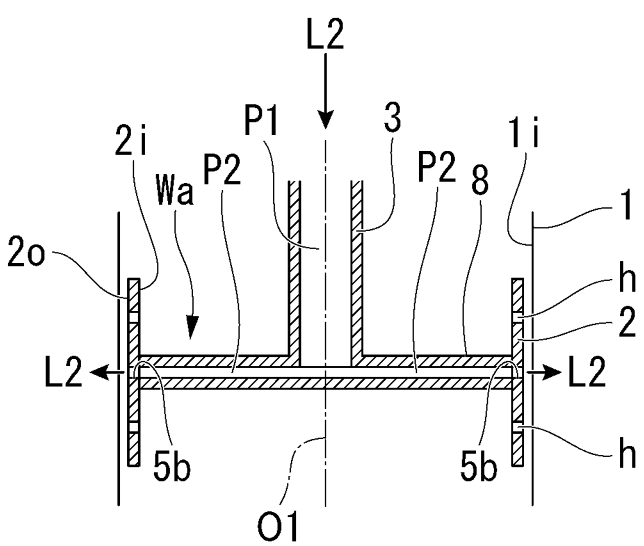
FIG. 5A is a front cross-sectional view of a schematic view of a main part showing a second modification example of the crystallization device of the first embodiment according to the present invention.
Figure 5B:
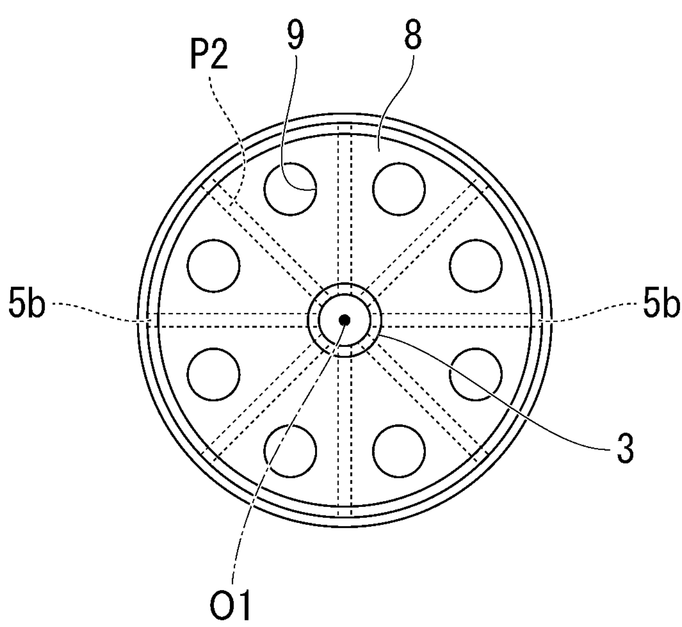
FIG. 5B is a top view of the schematic view of the main part showing the second modification example of the crystallization device of the first embodiment according to the present invention.

FIGS. 5A and 5B are schematic views of a main part showing a second modification example of the crystallization device 4 of the first embodiment. The second modification example is different in that the stirring blade W of the crystallization device 4 of the first embodiment is a stirring blade Wa. In the following description, only the difference from the stirring blade W will be described, and the description of overlapping parts will be omitted.

The stirring blade Wa is different from the stirring blade W in that, as shown in FIG. 5A, the second liquid supply portion 5*b* provided on the outer edge portion of the disk portion 8 penetrates the cylindrical portion 2 and is open to the radially outer side. In such a stirring blade Wa, since the second reaction liquid L2 is discharged from the second liquid supply portion 5*b* that is open to the radially outer side, the dispersibility of the second reaction liquid L2 and the liquid mixture of the first reaction liquid L1 and the second reaction liquid L2 in the radial direction (horizontal direction) is high. Also in a case in which the crystallization device 4 including the stirring blade Wa is used, the same effects as the effects of the crystallization device 4 including the stirring blade W can be obtained. It should be noted that, in the examples of FIGS. 5A and 5B, as shown in FIG. 5B, the plurality of holes 9 penetrating in the direction of the center axis O1 are provided in the disk portion 8, but the plurality of holes 9 do not have to be provided. In a case in which the plurality of holes 9 are provided, it is preferable that the plurality of holes 9 are provided symmetrically with respect to the center of the disk portion 8. In a case in which the plurality of holes 9 are provided, the number of the plurality of holes 9 is not limited to eight shown in FIG. 5B.

Here, since the plurality of holes 9 allow part of the liquid mixture to flow on the lower side and the upper side of the stirring blade W through the plurality of holes 9, and there is the effect of reducing the dynamic load applied to the stirring blade W. But since the liquid mixture passing through the plurality of holes 9 short-passes through the reaction field without passing through the reaction field around the stirring blade W, the effect of producing uniform and fine particles is decreased as compared with a case in which the plurality of holes 9 are not provided. Therefore, the application of the holes 9 can be selected in consideration of intended particle quality and required power.

Figure 6A:
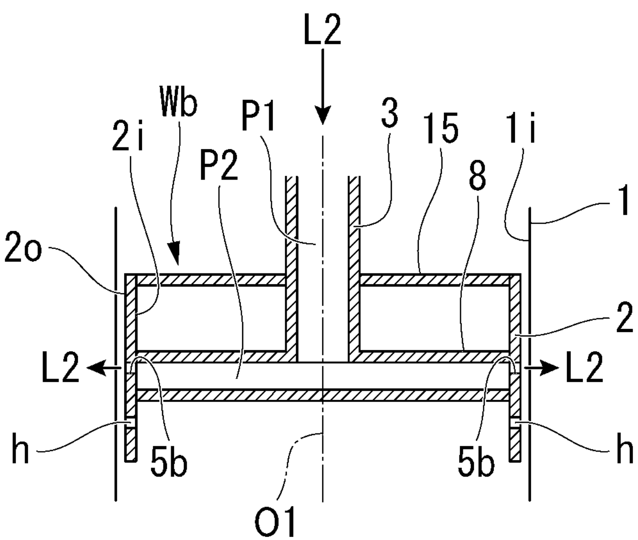
FIG. 6A is a front cross-sectional view of a schematic view of a main part showing a third modification example of the crystallization device of the first embodiment according to the present invention.
Figure 6B:
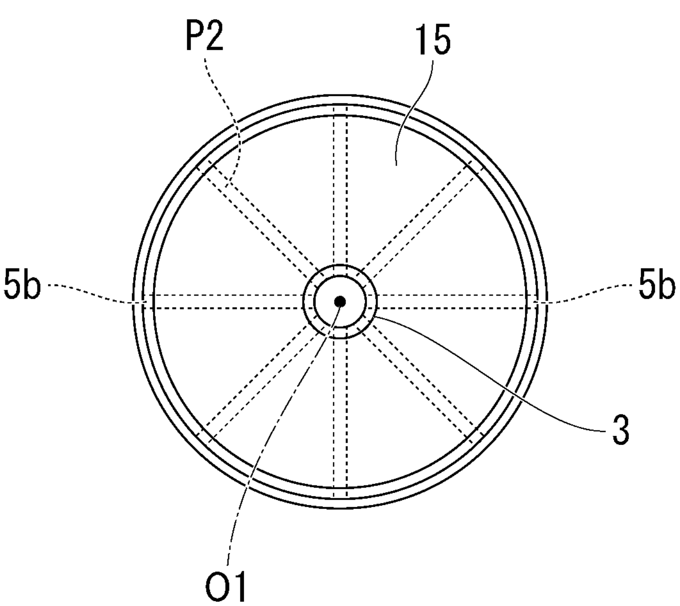
FIG. 6B is a top view of the schematic view of the main part showing the third modification example of the crystallization device of the first embodiment according to the present invention.

FIGS. 6A and 6B are schematic views of a main part showing a third modification example of the crystallization device 4 of the first embodiment. The third modification example is different in that the stirring blade Wa in the second modification example of the crystallization device 4 of the first embodiment is a stirring blade Wb. In the following description, only the difference from the stirring blade Wa will be described, and the description of overlapping parts will be omitted.

In the stirring blade Wb, as shown in FIG. 6A, in the cylindrical portion 2 above the disk portion 8 in the stirring blade Wb, the plurality of radially penetrating holes h are blocked, and a second disk portion 15 having the outer edge portion fixed to the inner peripheral surface 2*i* of the cylindrical portion 28 is provided on the upper end portion of the cylindrical portion 2. The second disk portion 15 is a member having a disk shape and has a hole through which the rotating shaft 3 penetrates in the center thereof. Except for the hole through which the rotating shaft 3 penetrates, there is no hole penetrating through the second disk portion 15 in the direction of the center axis O1. Therefore, the first reaction liquid L1, the second reaction liquid L2, and the liquid mixture thereof do not enter the inside of the second disk portion 15.

In such a stirring blade Wb, the plurality of radially penetrating holes h are not provided in the cylindrical portion 2 above the disk portion 8, and the second disk portion 15 having the outer edge portion fixed to the inner peripheral surface 2*i* of the cylindrical portion 2 is provided on the upper end portion of the cylindrical portion 2. Therefore, the resistance force of the stirring blade Wb in a case in which the stirring blade Wb rotates is reduced, and the stirring blade Wb can be operated with less power than the stirring blade Wa.

Figure 7A:
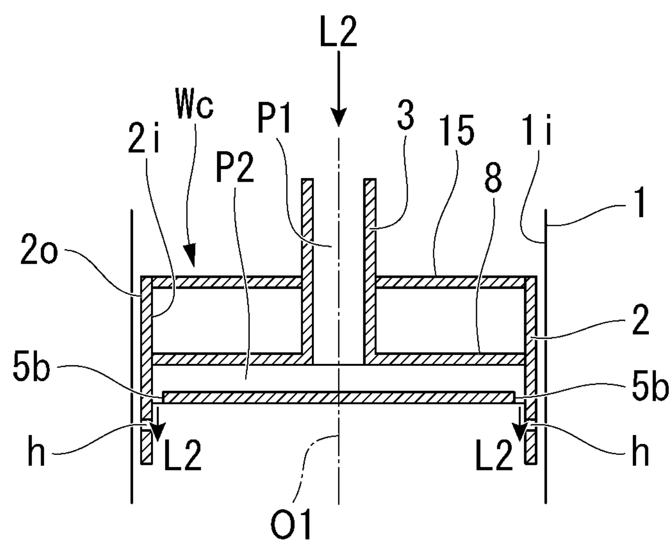
FIG. 7A is a front cross-sectional view of a schematic view of a main part showing a fourth modification example of the crystallization device of the first embodiment according to the present invention.
Figure 7B:
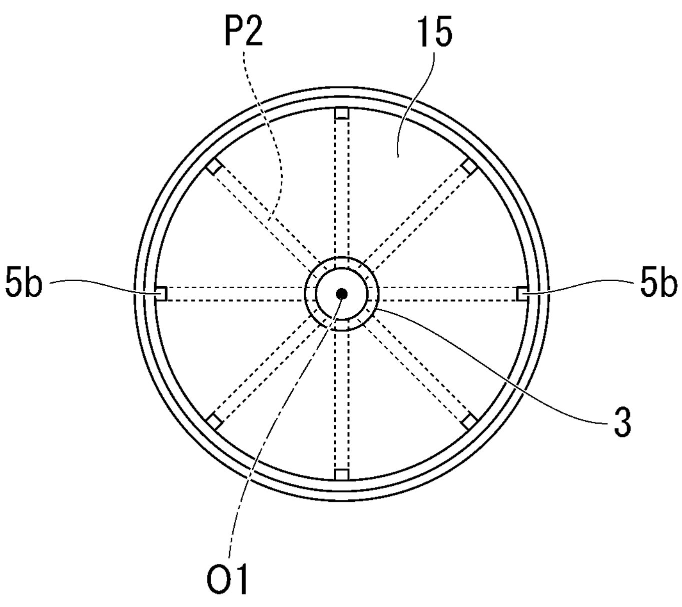
FIG. 7B is a top view of the schematic view of the main part showing the fourth modification example of the crystallization device of the first embodiment according to the present invention.

FIGS. 7A and 7B are schematic views of a main part showing a fourth modification example of the crystallization device 4 of the first embodiment. The fourth modification example is different in that the stirring blade W of the crystallization device 4 of the first embodiment is a stirring blade Wc. In the following description, only the difference from the stirring blade W will be described, and the description of overlapping parts will be omitted.

In the stirring blade Wc, as shown in FIG. 7A, in the cylindrical portion 2 above the disk portion 8 in the stirring blade Wc, the plurality of radially penetrating holes h are blocked, and the second disk portion 15 having the outer edge portion fixed to the inner peripheral surface 2*i* of the cylindrical portion 2 is provided on the upper end portion of the cylindrical portion 2. The second disk portion 15 is a member having a disk shape and has a hole through which the rotating shaft 3 penetrates in the center thereof. Except for the hole through which the rotating shaft 3 penetrates, there is no hole penetrating through the second disk portion 15 in the direction of the center axis O1. Therefore, the first reaction liquid L1, the second reaction liquid L2, and the liquid mixture thereof do not enter the inside of the second disk portion 15.

In such a stirring blade Wc, the plurality of radially penetrating holes h are not provided in the cylindrical portion 2 above the disk portion 8, and the second disk portion 15 having the outer edge portion fixed to the inner peripheral surface 2*i* of the cylindrical portion 2 is provided on the upper end portion of the cylindrical portion 2, so that the resistance force of the stirring blade Wc in a case in which the stirring blade Wc rotates is reduced. Therefore, the stirring blade Wc can be operated with less power than the stirring blade W.

Figure 8A:
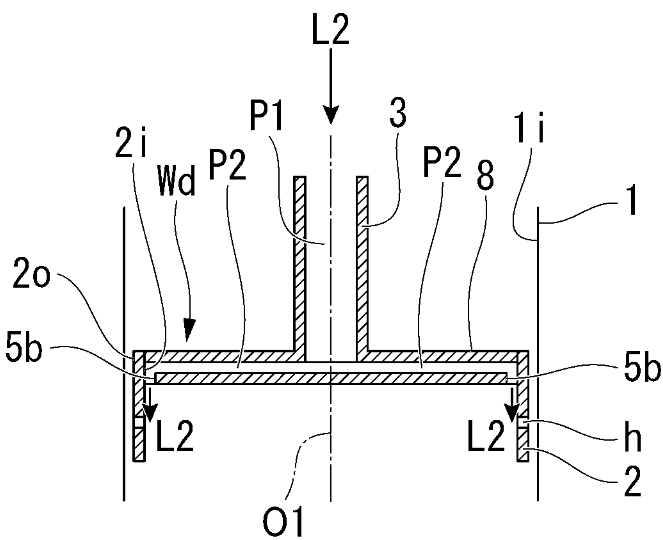
FIG. 8A is a front cross-sectional view of a schematic view of a main part showing a fifth modification example of the crystallization device of the first embodiment according to the present invention.
Figure 8B:
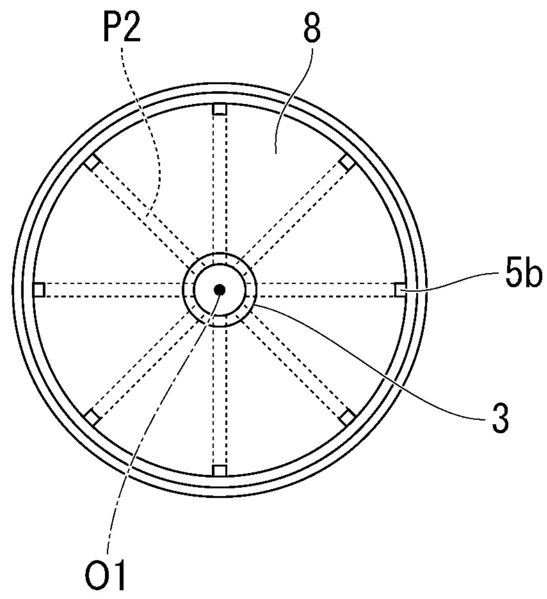
FIG. 8B is a top view of the schematic view of the main part showing the fifth modification example of the crystallization device of the first embodiment according to the present invention.

FIGS. 8A and 8B are schematic views of a main part showing a fifth modification example of the crystallization device 4 of the first embodiment. The fifth modification example is different in that the stirring blade W of the crystallization device 4 of the first embodiment is a stirring blade Wd. In the following description, only the difference from the stirring blade W will be described, and the description of overlapping parts will be omitted.

The stirring blade Wd is different from the stirring blade W in that the disk portion 8 is provided on the upper end portion of the cylindrical portion 2, as shown in FIG. 8A. In addition, the height of the cylindrical portion 2 is approximately half the height of the cylindrical portion 2 of the stirring blade W. Also, in a case in which the crystallization device 4 including the stirring blade Wd is used, the same effects as the effects of the crystallization device 4 including the stirring blade W can be obtained. In addition, since the cylindrical portion 2 is not provided above the disk portion 8, the stirring blade Wd can be made lighter than the stirring blade W, the stirring blade Wd can have a simple structure, and the stirring blade Wd can be operated with less power than the stirring blade W, so that the energy saving of the crystallization device 4 and facilitating the manufacturing of the stirring blade Wd can be expected. Further, since the height of the cylindrical portion 2 is suppressed to be short, the crystallization device 4 can be reduced in size. It should be noted that, in the examples of FIGS. 8A and 8B, as shown in FIG. 8B, the plurality of holes 9 penetrating in the direction of the center axis O1 are not provided in the disk portion 8, but the plurality of holes 9 may be provided. In that case, the same effects as the effects in a case in which the disk portion 8 of the stirring blade Wa is provided with the plurality of holes 9 penetrating in the direction of the center axis O1 can be expected.

Figure 9:
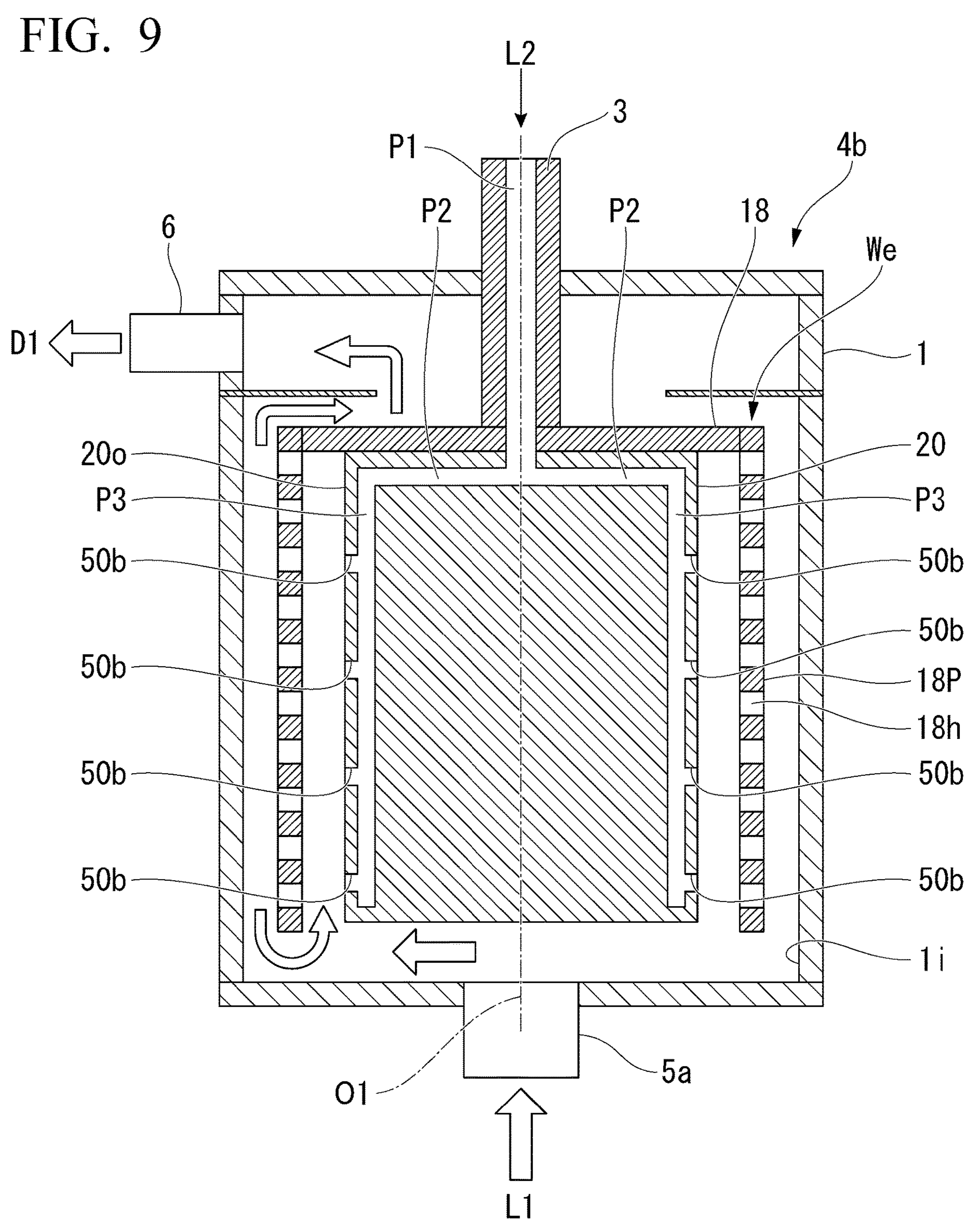
FIG. 9 is a schematic view of a main part showing a sixth modification example of the crystallization device of the first embodiment according to the present invention.

FIG. 9 is a schematic view of a main part showing a sixth modification example of the crystallization device 4 of the first embodiment. The sixth modification example is different in that the stirring blade W of the crystallization device 4 of the first embodiment is a stirring blade We. In the following description, only the difference from the stirring blade W will be mainly described, and the description of overlapping parts will be omitted.

As shown in FIG. 9, the stirring blade We includes the columnar portion 20 having a columnar shape, the disk base portion 18 provided concentrically with the columnar portion 20 on the upper end portion of the columnar portion 20, the rotating shaft 3 extending upward along the center axis O1 from the center of the disk base portion 18 in plan view, and the porous plate 18P having a cylindrical shape and provided concentrically with the columnar portion 20 on the radially outer side of the columnar portion 20. The porous plate 18P is provided with a plurality of holes 18*h* that penetrate the porous plate 18P in the radial direction, and the liquid mixture of the first reaction liquid L1 and the second reaction liquid L2 can flow through the plurality of holes 18*h*. The porous plate 18P extends downward from the outer edge of the disk base portion 18. The second reaction liquid can flow through pipelines P1, P2, and P3 provided inside each of the rotating shaft 3, the disk base portion 18, and the columnar portion 20. The pipelines P1, P2, and P3 communicate with each other. The pipelines P2 radially extend toward the radially outer side from the lower end portion of the pipeline P1 about the center axis O1. The pipelines P3 extend downward along the center axis O1 from the end portions on the radially outer side of the pipelines P2. The pipelines P2 and the pipelines P3 are formed inside the columnar portion 20. The plurality of second liquid supply portions 50*b* are provided on the outer peripheral surface 20*o* of the columnar portion 20 at intervals in the up-down direction. In a case in which the stirring blade We rotates, the rotating shaft 3, the disk base portion 18, the columnar portion 20, and the porous plate 18P rotate integrally.

In such a stirring blade We, the second reaction liquid L2 is supplied inside the reaction tank 1 from the plurality of second liquid supply portions 50*b* provided at intervals in the up-down direction on the outer peripheral surface 20*o* of the columnar portion 20 and flows through the plurality of holes 18*h* of the porous plate 18P while mixing and reacting with the first reaction liquid L1 in the reaction tank 1. Therefore, the first reaction liquid L1 and the second reaction liquid L2 can be mixed more uniformly.

The liquid mixture passing through the plurality of holes 18*h* of the porous plate 18P collides with the inner peripheral surface 1*i* of the reaction tank 1, and then moves in the up-down direction along the inner peripheral surface 1*i* of the reaction tank 1. The liquid mixture moved downward is attracted to the flow toward the radially outer side caused by the centrifugal force generated by the rotation of the stirring blade We, passes through the plurality of holes 18*h* provided in the porous plate 18P of the stirring blade We again, collides with the inner peripheral surface 1*i* of the reaction tank 1, and then is moved in the up-down direction along the inner peripheral surface 1*i* of the reaction tank 1 to generate convection. Here, in a case in which the liquid mixture passes through the plurality of holes 18*h*, the liquid mixture is accelerated to the radially outer side due to the effect of the restriction flow path, so that the radial outward flow rate of the liquid mixture is highest in the vicinity of the plurality of holes 18*h*. Further, the shearing force in the circumferential direction is applied to the liquid mixture, which is present between the outer peripheral surface 20*o* of the columnar portion 20 and the inner and outer peripheral surfaces of the porous plate 18P of the stirring blade We rotating at the peripheral velocity of 5 m/seconds or more and 50 m/seconds or less, and the inner peripheral surface 1*i* of the reaction tank 1 that is fixed. The shearing force applied to the liquid mixture is larger on a side closer to the outer peripheral surface 2*o* of the columnar portion 20 of the stirring blade We and the inner and outer peripheral surfaces of the porous plate 18P. The shearing force applied to the liquid mixture is a major factor that determines the particle size and the uniformity of the particles to be obtained. In particular, as the applied shearing force is larger, the particles having a finer particle size can be obtained. In a case in which the stirring blade We is used, the influence of the shearing force can be applied to a larger number of places than in a case in which the stirring blade W is used, so that it is possible to produce uniform and fine particles.

The second reaction liquid L2 supplied from the second liquid supply portion 50*b* can be supplied to the range within the very close distance, for example, 2 mm from the inner and outer peripheries of the stirring blade We having the highest shearing force, that is, the outer peripheral surface 20*o* of the columnar portion 20 and the inner and outer peripheral surfaces of the porous plate 18P.

In the example of FIG. 9, four second liquid supply portions 50*b* are provided in the up-down direction of the columnar portion 20, but the number of the second liquid supply portions 50*b* is not limited to the example of FIG. 9, and may be increased or decreased depending on the size of the reaction tank 1.

Figure 10:
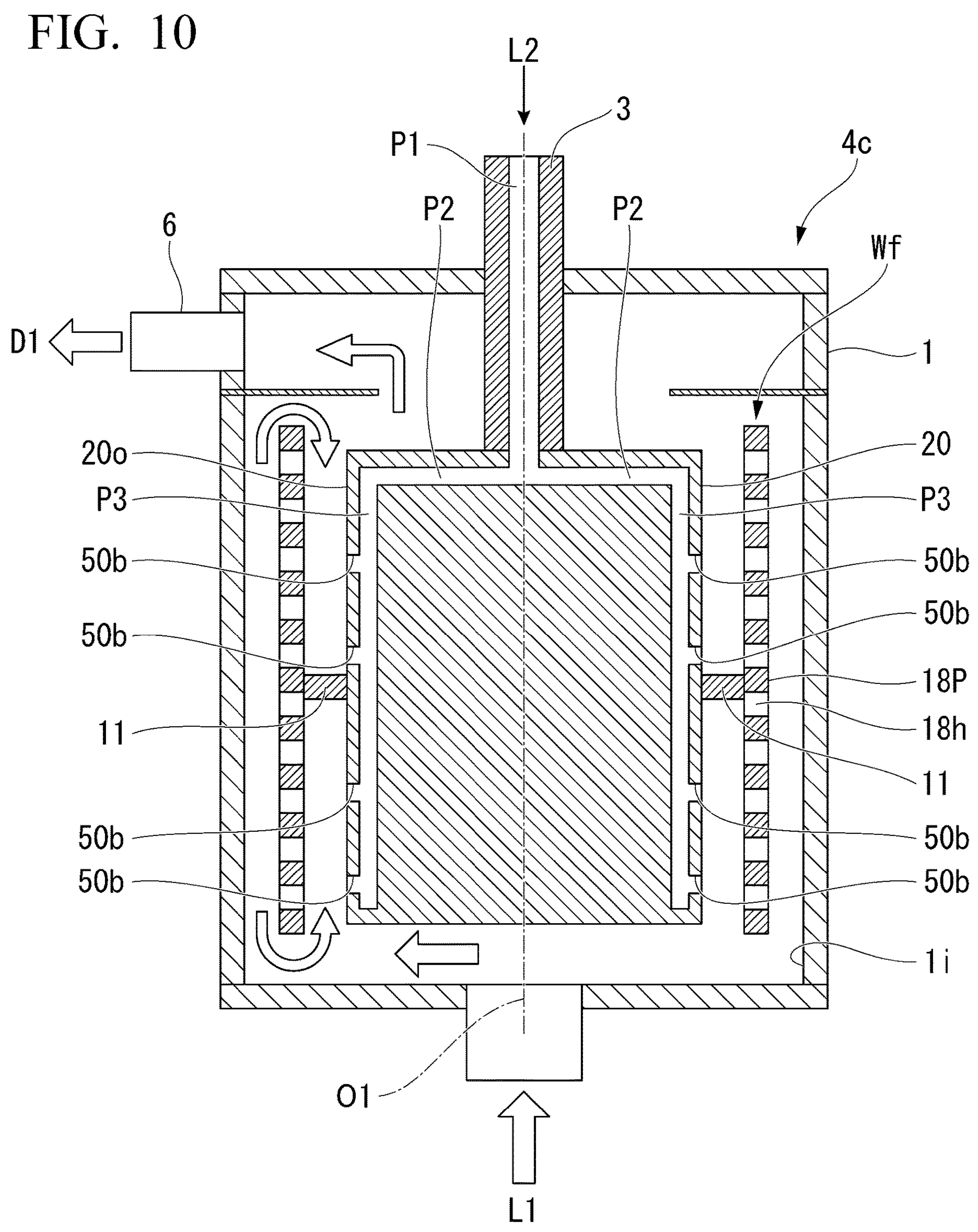
FIG. 10 is a schematic view of a main part showing a seventh modification example of the crystallization device of the first embodiment according to the present invention.

FIG. 10 is a schematic view of a main part showing a seventh modification example of the crystallization device 4 of the first embodiment. The seventh modification example is different in that the stirring blade W of the crystallization device 4 of the first embodiment is a stirring blade Wf. In the following description, only the difference from the stirring blade W will be mainly described, and the description of overlapping parts will be omitted.

As shown in FIG. 10, the stirring blade Wf includes the columnar portion 20 having a columnar shape, the rotating shaft 3 extending upward along the center axis O1 from the center of the columnar portion 20 in plan view, and the porous plate 18P having a cylindrical shape and provided concentrically with the columnar portion 20 on the radially outer side of the columnar portion 20. The porous plate 18P is provided with a plurality of holes 18*h* that penetrate the porous plate 18P in the radial direction, and the liquid mixture of the first reaction liquid L1 and the second reaction liquid L2 can flow through the plurality of holes 18*h*. The porous plate 18P is fixed to the connecting rod 11 extending to the radially outer side from the outer peripheral surface 2*o* of the columnar portion 20. The second reaction liquid can flow through the pipelines P1, P2, and P3 provided inside each of the rotating shaft 3 and the columnar portion 20. The pipelines P1, P2, and P3 communicate with each other. The pipelines P2 radially extend toward the radially outer side from the lower end portion of the pipeline P1 about the center axis O1. The pipelines P3 extend downward along the center axis O1 from the end portion on the radially outer side of the pipelines P2. The pipelines P2 and the pipelines P3 are formed inside the columnar portion 20. The plurality of second liquid supply portions 50*b* are provided on the outer peripheral surface 20*o* of the columnar portion 20 at intervals in the up-down direction. In a case in which the stirring blade Wf rotates, the rotating shaft 3, the columnar portion 20, the connecting rod 11, and the porous plate 18P rotate integrally. A plurality of connecting rods 11 are provided at equal intervals in the circumferential direction of the columnar portion 20. It is preferable that two or more connecting rods 11 are provided. Although the connecting rod 11 is provided at a position substantially half of the height of the columnar portion 20, the present invention is not limited to this example, and the connecting rod 11 may be provided above or below substantially half the height of the columnar portion 20.

In such a stirring blade Wf, the second reaction liquid L2 is supplied inside the reaction tank 1 from the plurality of second liquid supply portions 50*b* provided at intervals in the up-down direction on the outer peripheral surface 20*o* of the columnar portion 20 and flows through the plurality of holes 18*h* of the porous plate 18P while mixing and reacting with the first reaction liquid L1 in the reaction tank 1. Therefore, the first reaction liquid L1 and the second reaction liquid L2 can be mixed more uniformly.

The liquid mixture passing through the plurality of holes 18*h* of the porous plate 18P collides with the inner peripheral surface 1*i* of the reaction tank 1, and then moves in the up-down direction along the inner peripheral surface 1*i* of the reaction tank 1. The liquid mixture moved in the up-down direction is attracted to the flow toward the radially outer side caused by the centrifugal force generated by the rotation of the stirring blade Wf, passes through the plurality of holes 18*h* provided in the porous plate 18P of the stirring blade We again, collides with the inner peripheral surface 1*i* of the reaction tank 1, and then is moved in the up-down direction along the inner peripheral surface 1*i* of the reaction tank 1 to generate convection. Here, in a case in which the liquid mixture passes through the plurality of holes 18*h*, the liquid mixture is accelerated to the radially outer side due to the effect of the restriction flow path, so that the radial outward flow rate of the liquid mixture is highest in the vicinity of the plurality of holes 18*h*. Further, the shearing force in the circumferential direction is applied to the liquid mixture, which is present between the outer peripheral surface 20*o* and the inner and outer peripheral surfaces of the porous plate 18P of the columnar portion 20 of the stirring blade Wf rotating at the peripheral velocity of 5 m/seconds or more and 50 m/seconds or less, and the inner peripheral surface 1*i* of the reaction tank 1 that is fixed. The shearing force applied to the liquid mixture is larger on a side closer to the outer peripheral surface 2*o* of the columnar portion 20 of the stirring blade Wf and the inner and outer peripheral surfaces of the porous plate 18P. The shearing force applied to the liquid mixture is a major factor that determines the particle size and the uniformity of the particles to be obtained. In particular, as the applied shearing force is larger, the particles having a finer particle size can be obtained. In a case in which the stirring blade Wf is used, the influence of the shearing force can be applied to a larger number of places, so that uniform and fine particles can be produced.

The second reaction liquid L2 supplied from the second liquid supply portion 50*b* can be supplied to the range within the very close distance, for example, 2 mm from the inner and outer peripheries of the stirring blade We having the highest shearing force, that is, the outer peripheral surface 20*o* of the columnar portion 20 and the inner and outer peripheral surfaces of the porous plate 18P.

In the example of FIG. 10, four second liquid supply portions 50*b* are provided in the up-down direction of the columnar portion 20, but the number of the second liquid supply portions 50*b* is not limited to the example of FIG. 10, and may be increased or decreased depending on the size of the reaction tank 1.

Figure 11:
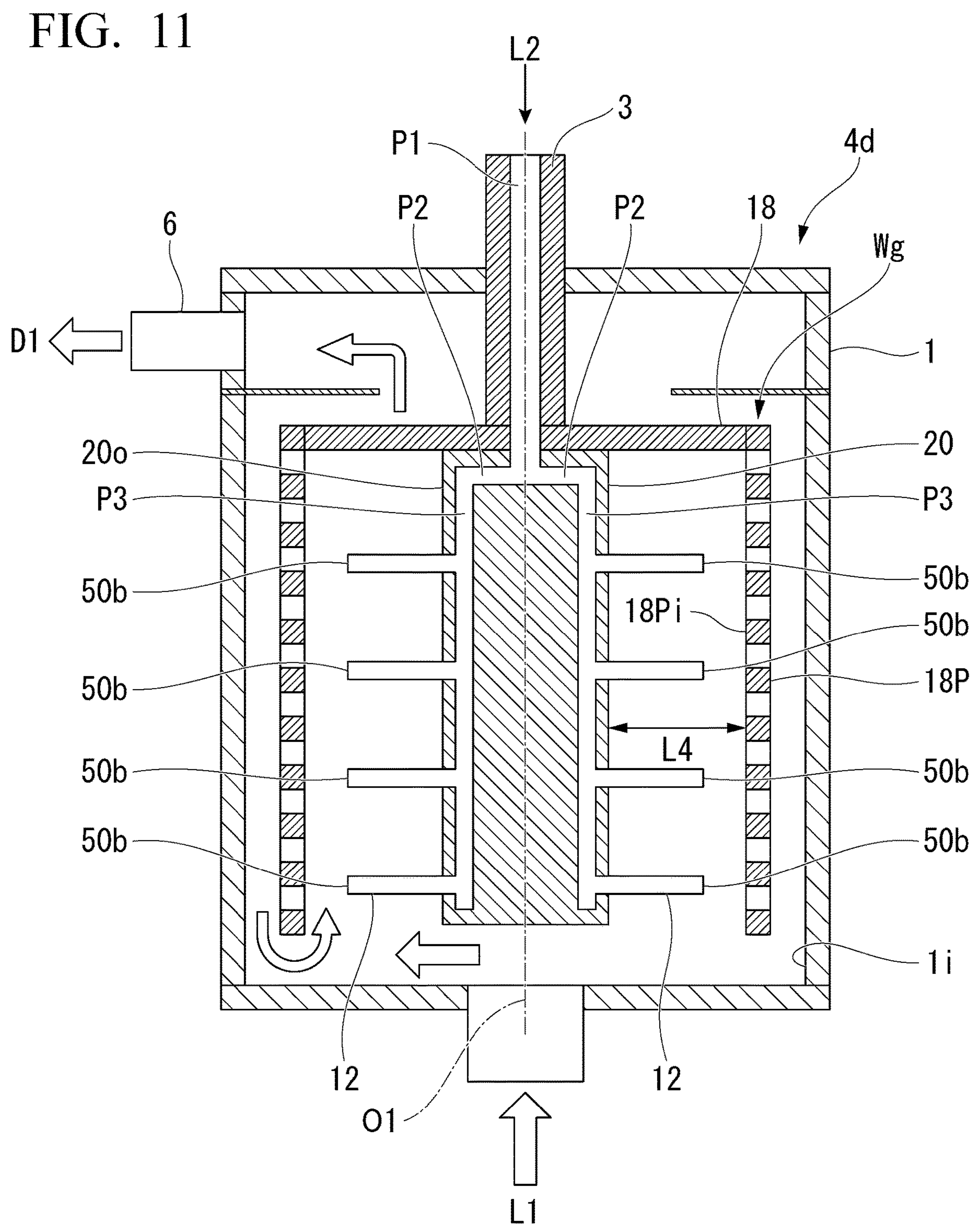
FIG. 11 is a schematic view of a main part showing an eighth modification example of the crystallization device of the first embodiment according to the present invention.

FIG. 11 is a schematic view of a main part showing an eighth modification example of the crystallization device 4 of the first embodiment. The eighth modification example is different in that the stirring blade We in the sixth modification example of the crystallization device 4 of the first embodiment is a stirring blade Wg. In the following description, only the difference from the stirring blade We will be described, and the description of overlapping parts will be omitted.

As shown in FIG. 11, the stirring blade Wg has a wider interval between the outer peripheral surface 20*o* of the columnar portion 20 and the inner peripheral surface of the porous plate 18P than the stirring blade We of the sixth modification example. In addition, an extension pipe 12 which further extends to the radially outer side from the second liquid supply portion 50*b* that is open to the radially outer side of the stirring blade We is provided, and a distal end of the extension pipe 12 is the second liquid supply portion 50*b*.

With such a stirring blade Wg, it is possible to widen the interval between the outer peripheral surface 20*o* of the columnar portion 20 and the inner peripheral surface of the porous plate 18P, and so that the first reaction liquid L1, the second reaction liquid L2, and the liquid mixture thereof are likely to flow between the columnar portion 20 and the porous plate 18P. Therefore, it is possible to promote the circulation of the reaction liquid, and thus uniform and fine particles can be produced. In addition, the second reaction liquid L2 supplied from the second liquid supply portion 50*b* can be supplied to the range within the very close distance, for example, 2 mm from the inner and outer peripheries of the stirring blade Wg having the highest shearing force, that is, the inner and outer peripheral surfaces of the porous plate 18P.

Figure 12:
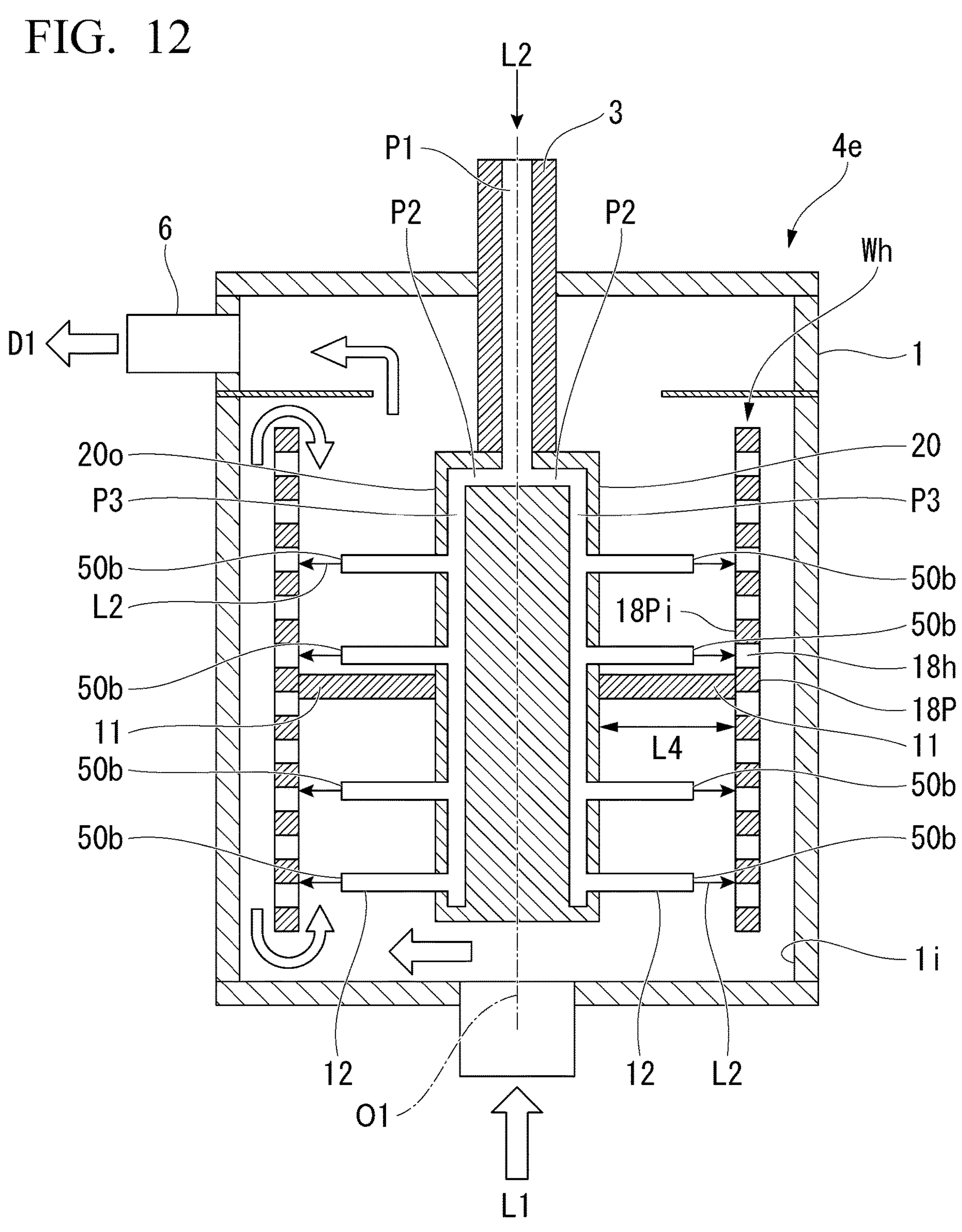
FIG. 12 is a schematic view of a main part showing a ninth modification example of the crystallization device of the first embodiment according to the present invention.

FIG. 12 is a schematic view of a main part showing a ninth modification example of the crystallization device 4 of the first embodiment. The ninth modification example is different in that the stirring blade Wf in the seventh modification example of the crystallization device 4 of the first embodiment is a stirring blade Wh. In the following description, only the difference from the stirring blade Wf will be described, and the description of overlapping parts will be omitted.

As shown in FIG. 12, the stirring blade Wh has a wider interval between the outer peripheral surface 20*o* of the columnar portion 20 and the porous plate 18P than the stirring blade Wf of the seventh modification example. In addition, an extension pipe 12 which further extends to the radially outer side from the second liquid supply portion 50*b* that is open to the radially outer side of the stirring blade Wf is provided, and a distal end of the extension pipe 12 is the second liquid supply portion 50*b*.

With such a stirring blade Wh, it is possible to widen the interval between the outer peripheral surface 20*o* of the columnar portion 20 and the inner peripheral surface of the porous plate 18P, and so that the first reaction liquid L1, the second reaction liquid L2, and the liquid mixture thereof are likely to flow between the columnar portion 20 and the porous plate 18P. Therefore, it is possible to promote the circulation of the reaction liquid, and thus uniform and fine particles can be produced. In addition, the second reaction liquid L2 supplied from the second liquid supply portion 50*b* can be supplied to the range within the very close distance, for example, 2 mm from the inner and outer peripheries of the stirring blade Wg having the highest shearing force, that is, the inner and outer peripheral surfaces of the porous plate 18P.

Among the above-described modification examples, in the stirring blade W of the crystallization device 4 according to the first embodiment, the stirring blade We according to the fourth modification example, and the stirring blade Wd according to the fifth modification example in which the second liquid supply portion 5*b* is open downward, the first reaction liquid L1 and the second reaction liquid L2 can be mixed more uniformly.

It should be noted that generating the particles by using the crystallization device described in the above-described embodiment can be regarded as a crystallization method.

For example, the crystallization device 4 of the first embodiment can be regarded as a crystallization method in the crystallization device 4 including the stirring blade W having a cylindrical shape, including the plurality of radially penetrating holes h, and rotating about the center axis O1, the reaction tank 1 having a bottomed cylindrical shape and concentrically accommodating the stirring blade W inside, the first liquid supply portion 5*a* provided on the reaction tank 1 and supplying the first reaction liquid L1 to the inside of the reaction tank 1, and the second liquid supply portion 5*b* provided on the stirring blade W and supplying the second reaction liquid L2 to the inside of the reaction tank 1, the crystallization method including a first liquid supply step of supplying the first reaction liquid L1 from the first liquid supply portion 5*a* to the reaction tank 1, and a second liquid supply step of supplying the second reaction liquid L2 from the second liquid supply portion 5*b* to the reaction tank 1. With such a crystallization method, the same effects as the effects of the crystallization device 4 of the first embodiment can be obtained.

Further, the crystallization device 4 of the first embodiment can be regarded as the crystallization method in which the stirring blade W further includes the cylindrical portion 2 having a cylindrical shape, the disk portion 8 having a disk shape and having the outer edge portion fixed to the inner peripheral surface 2*i* of the cylindrical portion 2, and the rotating shaft 3 extending upward along the center axis O1 from the center of the disk portion 8 in plan view, the second reaction liquid is flowable inside the disk portion 8 and the rotating shaft 3, and in the second liquid supply step, the second reaction liquid L2 is supplied downward from the outer edge portion of the disk portion 8. With such a crystallization method, the same effects as the effects of the crystallization device 4 of the first embodiment can be obtained.

Further, the second modification example of the crystallization device 4 of the first embodiment can be regarded as the crystallization method in which the stirring blade Wa further includes the cylindrical portion 2 having a cylindrical shape, the disk portion 8 having a disk shape and having the outer edge portion fixed to the inner peripheral surface of the cylindrical portion 2, and the rotating shaft 3 extending upward along the center axis O1 from the center of the disk portion 8 in plan view, the second reaction liquid L2 is flowable inside the disk portion 8 and the rotating shaft 3, and in the second liquid supply step, the second reaction liquid L2 is supplied toward the radially outer side so as to pass through the cylindrical portion from the outer edge portion of the disk portion 8. With such a crystallization method, the same effects as the effects of the crystallization device 4 of the first embodiment can be obtained.

Further, the sixth modification example of the crystallization device 4 of the first embodiment can be regarded as the crystallization method, in which the stirring blade We includes the columnar portion 20 having a columnar shape, the disk base portion 18 provided concentrically with the columnar portion 20 on the upper end portion of the columnar portion 20, the rotating shaft 3 extending upward along the center axis O1 from the center of the disk base portion 18 in plan view, and the porous plate 18P having a cylindrical shape and provided concentrically with the columnar portion 20 on the radially outer side of the columnar portion 20, the porous plate 18P extends downward from the outer edge of the disk base portion 18, the second reaction liquid L2 is flowable inside the rotating shaft 3, the disk base portion 18, and the columnar portion 20, and in the second liquid supply step, the second reaction liquid L2 is supplied toward the radially outer side from the plurality of second liquid supply portions 50*b*, which are provided on the outer peripheral surface 20*o* of the columnar portion 20 at intervals in the up-down direction. With such a crystallization method, the first reaction liquid and the second reaction liquid can be mixed more uniformly. In addition, the second reaction liquid L2 can be supplied to the range within the very close distance, for example, 2 mm from the inner and outer peripheries of the stirring blade We having the highest shearing force, that is, the outer peripheral surface 20*o* of the columnar portion 20 and the inner and outer peripheries of the porous plate 18P, and the influence of the shearing force can be applied to a larger number of places, so that uniform and fine particles can be produced.

Further, the seventh modification example of the crystallization device 4 of the first embodiment can be regarded as the crystallization method, in which the stirring blade Wf includes the columnar portion 20 having a columnar shape, the rotating shaft 3 extending upward along the center axis O1 from the center of the columnar portion 20 in plan view, and the porous plate 18P having a cylindrical shape and provided concentrically with the columnar portion 20 on the radially outer side of the columnar portion 20, the porous plate 18P is fixed to the connecting rod 11 extending from the outer peripheral surface 20*o* of the columnar portion 20 toward the radially outer side, the second reaction liquid L2 is flowable inside the rotating shaft 3 and the columnar portion 20, and in the second liquid supply step, the second reaction liquid L2 is supplied toward the radially outer side from the plurality of second liquid supply portions 50*b*, which are provided on the outer peripheral surface 20*o* of the columnar portion 20 at intervals in the up-down direction. With such a crystallization method, the first reaction liquid and the second reaction liquid can be mixed more uniformly. In addition, the second reaction liquid can be supplied to the range within the very close distance, for example, 2 mm from the inner and outer peripheries of the stirring blade Wf having the highest shearing force, that is, the outer peripheral surface 20*o* of the columnar portion 20 and the inner and outer peripheries of the porous plate 18P, and the influence of the shearing force can be applied to a larger number of places, so that uniform and fine particles can be produced.

Although the embodiment of the present invention and the modification examples thereof have been described in detail so far with reference to the drawings, a specific configuration is not limited to the embodiment and the modification examples thereof, and also includes designs and the like within a range that does not deviate from the gist of the present invention, and combinations of the embodiment and the modification examples with each other.

For example, in the above-described embodiment, two types of reaction liquids, the first reaction liquid L1 and the second reaction liquid L2, are mixed to obtain the product, but three or more types of reaction liquids may be mixed.

INDUSTRIAL APPLICABILITY

According to the embodiment of the present invention, it is possible to obtain the crystallization device, the crystallization system, and the crystallization method capable of minimizing the clearance between the stirring blade and the reaction liquid supply nozzle without requiring high manufacturing accuracy and capable of using the range within the very close distance, for example, 2 mm from the inner and outer peripheries of the stirring blade having the highest shearing force as the reaction beginning point at which the reaction begins.

REFERENCE SIGNS LIST

1: Reaction tank
2: Cylindrical portion
3: Rotating shaft
4: Crystallization device
5*a*: First liquid supply portion
5*b*: Second liquid supply portion
6: Discharge port
7: Baffle (baffle plate)
8: Disk portion
9, h: Hole

What is claimed is:

1. A crystallization device comprising:
a stirring blade rotating about a center axis;
a reaction tank having a bottomed cylindrical shape and concentrically accommodating the stirring blade inside;
a first liquid supply portion provided on the reaction tank and supplying a first reaction liquid to the inside of the reaction tank; and
a second liquid supply portion provided on the stirring blade and supplying a second reaction liquid to the inside of the reaction tank,
wherein the stirring blade includes;
a rotating shaft,
a disk portion having a disk shape and extending radially outward from a lower portion of the rotating shaft; and
a cylindrical portion having a cylindrical shape concentrically with the rotating shaft and separate from the rotating shaft, and fixed to a most radially outer edge portion of the disk portion:
the cylindrical portion includes a plurality of radially penetrating holes,
the second reaction liquid is flowable inside the rotating shaft and the disk portion, and
the second liquid supply portion is provided on the outer edge portion of the disk portion.

2. The crystallization device according to claim 1, wherein the second liquid supply portion is open downward.

3. The crystallization device according to claim 1, wherein the second liquid supply portion is open toward a radially outer side and penetrates the cylindrical portion.

4. The crystallization device according to claim 2, wherein, in the cylindrical portion above the disk portion, the plurality of radially penetrating holes are blocked, and
a second disk portion having a disk shape and having an outer edge portion fixed to the inner peripheral surface of the cylindrical portion is provided on an upper end portion of the cylindrical portion.

5. The crystallization device according to claim 2, wherein the disk portion is provided on an upper end of the cylindrical portion.

6. The crystallization device according to claim 1, wherein a peripheral velocity of the stirring blade is 5 m/seconds or more and 50 m/seconds or less.

7. The crystallization device according to claim 1, wherein, in a case in which a clearance between an outer peripheral surface of the cylindrical portion and an inner peripheral surface of the reaction tank is denoted by L3 and a height of the cylindrical portion is denoted by H, H/L3 is 10 or more.

8. The crystallization device according to claim 1, wherein a plurality of second liquid supply portions that include the second liquid supply portion are provided.

9. A crystallization device comprising:
a stirring blade rotating about a center axis;
a reaction tank having a bottomed cylindrical shape and co centrically accommodating the stirring blade inside;
a first liquid supply portion provided on the reaction tank and supplying a first reaction liquid to the inside of the reaction tank; and
a second liquid supply portion provided on the stirring blade and supplying a second reaction liquid to the inside of the reaction tank,
wherein the stirring blade includes:
a rotating shaft;
a disk base portion having a disk shape and extending radially outward from a lower portion of the rotating shaft;
a columnar portion having a columnar shape concentrically with the rotating shaft and extending downward from the disk base portion; and
a porous plate having a cylindrical shape concentrically with the columnar portion and separate from the rotating shaft and the columnar portion, disposing radially outward than the columnar portion, and fixed to a most radially outer edge portion of the disk base portion, the porous plate includes a plurality of radially penetrating holes, the porous plate extends downward from the outer edge portion of the disk base portion, the second reaction liquid is flowable inside the rotating shaft, the disk base portion, and the columnar portion, and a plurality of second liquid supply portions that include the second liquid supply portion are provided on an outer peripheral surface of the columnar portion at intervals in an up-down direction.

10. A crystallization system comprising:

the crystallization device according to claim 1;

a retention tank that retains a product transferred from the reaction tank; and a circulation pump that circulates the product between the retention tank and the crystallization device.

11. The crystallization device according to claim 3, wherein, in the cylindrical portion above the disk portion, the plurality of radially penetrating holes are blocked, and a second disk portion having a disk shape and having an outer edge portion fixed to the inner peripheral surface of the cylindrical portion is provided on an upper end portion of the cylindrical portion.

12. A crystallization device comprising:

a stirring blade rotating about a center axis;

a reaction tank having a bottomed cylindrical shape and concentrically accommodating the stirring blade inside;

a first liquid supply portion provided on the reaction tank and supplying a first reaction liquid to the inside of the reaction tank; and a second liquid supply portion provided on the stirring blade and supplying a second reaction liquid to the inside of the reaction tank, wherein the stirring blade includes:

a rotating shaft; and a columnar portion having a columnar shape concentrically with the rotating shaft and extending downward from a lower portion of the rotating shaft;

a connecting rod extending to a radially outer side from an outer peripheral surface of the columnar portion;

a porous plate having a cylindrical shape concentrically with columnar portion and separate from the rotating shaft and the columnar portion, disposing radially outward than the columnar portion, and fixed to the outer peripheral surface of the columnar portion by the connecting rod, the porous plate includes a plurality of radially penetrating holes, the second reaction liquid is flowable inside the rotating shaft and the columnar portion, and a plurality of second liquid supply portions that include the second liquid supply portion are provided on the outer peripheral surface of the columnar portion at intervals in an up-down direction.

13. The crystallization device according to claim 1, wherein a first pipeline that the second reaction liquid is flowable therein is provided inside the rotating shaft, second pipelines that the second reaction liquid is flowable therein are provided inside the disk base portion, and the first pipeline and the second pipelines communicate with each other, wherein the second pipelines extend toward a radially outer side from a lower end portion of the first pipeline about the center axis, and the entire length of the second pipelines is disposed on the inner side of the cylindrical portion.

14. The crystallization device according to claim 12, wherein extension pipes extending from the plurality of second liquid supply portions toward the radially outer side are provided.

15. The crystallization device according to claim 9, wherein extension pipes extending from the plurality of second liquid supply portions toward the radially outer side are provided.

16. A crystallization method in a crystallization device including:

a stirring blade rotating about a center axis;

a reaction tank having a bottomed cylindrical shape and concentrically accommodating the stirring blade inside;

a first liquid supply portion provided on the reaction tank and supplying a first reaction liquid to the inside of the reaction tank; and a second liquid supply portion provided on the stirring blade and supplying a second reaction liquid to the inside of the reaction tank, the crystallization method comprising:

a first liquid supply step of supplying the first reaction liquid from the first liquid supply portion to the reaction tank; and a second liquid supply step of supplying the second reaction liquid from the second liquid supply portion, wherein the stirring blade includes:

a rotating shaft, a disk portion having a disk shape and extending radially outward from a lower portion of the rotating shaft; and a cylindrical portion having a cylindrical shape concentrically with the rotating shaft and separate from the rotating shaft, and fixed to a most radially outer edge portion of the disk portion;

the cylindrical portion includes a plurality radially at holes, the second reaction liquid is flowable inside the rotating shaft and the disk portion, and the second liquid supply portion is provided on the outer edge portion of the disk portion.

17. The crystallization method according to claim 16, wherein the second reaction liquid is flowable inside the disk portion and the rotating shaft, and in the second liquid supply step, the second reaction liquid is supplied downward from the outer edge portion of the disk portion.

18. The crystallization method according to claim 16, wherein the second reaction liquid is flowable inside the disk portion and the rotating shaft, and in the second liquid supply step, the second reaction liquid is supplied toward a radially outer side so as to pass through the cylindrical portion from the outer edge portion of the disk portion.

19. A crystallization method in a crystallization device including:

a stirring blade rotating about a center axis;

a reaction tank having a bottomed cylindrical shape and concentrically accommodating the stirring blade inside;

a first liquid supply portion provided on the reaction tank and supplying a first reaction liquid to the inside of the reaction tank; and a second liquid supply portion provided on the stirring blade and supplying a second reaction liquid to the inside of the reaction tank, the crystallization method comprising:

a first liquid supply step of supplying the first reaction liquid from the first liquid supply portion to the reaction tank; and a second liquid supply step of supplying the second reaction liquid from the second liquid apply portion, wherein the stirring blade includes:

a rotating shaft;

a disk base portion having a dis sha e and extending radially outward from a lower portion of the rotating shaft;

a columnar portion having a columnar shape concentrically with the rotating shaft and extending downward from the disk base portion; and a porous plate having a cylindrical shape concentrically with the columnar portion and separate from the rotating shaft and the columnar portion, disposing radially outward than the columnar portion, and fixed to a most radially outer edge portion of the disk base portion, the porous plate includes a plurality of radially penetrating holes, the porous plate extends downward from the outer edge portion of the disk base portion, the second reaction liquid is flowable inside the rotating shaft, the disk base portion, and the columnar portion, and in the second liquid supply step, the second reaction liquid is supplied toward the radially outer side from a plurality of second liquid supply portions that include the second liquid supply portion, which are provided on an outer peripheral surface of the columnar portion at intervals in an up-down direction.

20. A crystallization method in a crystallization device including:

a stirring blade rotating about a center axis;

a reaction tank having a bottomed cylindrical shape and concentrically accommodating the stirring blade inside;

a first liquid supply portion provided on the reaction tank and supplying a first reaction liquid to the inside of the reaction tank; and a second liquid supply portion provided on the stirring blade and supplying a second reaction liquid to the inside of the reaction tank, the crystallization method comprising:

a first liquid supply step of supplying the first reaction liquid from the first liquid supply portion to the reaction tank; and a second liquid supply step of supplying the second reaction liquid from the second liquid supply portion, wherein the stirring blade includes:

a rotating shaft; and a columnar portion having a columnar shape concentrically with the rotating shaft and extending downward from a lower portion of the rotating shaft;

a connecting rod extending to a radially outer side from an outer peripheral surface of the columnar portion;

a porous plate having a cylindrical shape concentrically with the columnar portion and separate from the rotating shaft and the columnar portion, disposing radially outward the the columnar portion, and fixed to the outer peripheral surface of the columnar portion by the connecting rod, the second reaction liquid is flowable inside the rotating shaft and the columnar portion, and in the second liquid supply step, the second reaction liquid is supplied toward the radially outer side from a plurality of second liquid supply portions that include the second liquid supply portion, which are provided on the outer peripheral surface of the columnar portion at intervals in an up-down direction.

* * * * *